(12) United States Patent
Kim et al.

(10) Patent No.: US 10,381,369 B2
(45) Date of Patent: Aug. 13, 2019

(54) VERTICAL SEMICONDUCTOR MEMORY DEVICE STRUCTURES INCLUDING VERTICAL CHANNEL STRUCTURES AND VERTICAL DUMMY STRUCTURES

(71) Applicant: Samsung Electronics Co., Ltd., Suwon-si, Gyeonggi-do (KR)

(72) Inventors: Hongsoo Kim, Seongnam-si (KR); Hyunmog Park, Seoul (KR); Joongshik Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/841,644

(22) Filed: Dec. 14, 2017

(65) Prior Publication Data

US 2018/0240811 A1 Aug. 23, 2018

(30) Foreign Application Priority Data

Feb. 21, 2017 (KR) .......... 10-2017-0023114

(51) Int. Cl.
| | |
|---|---|
| *H01L 27/11578* | (2017.01) |
| *H01L 27/11582* | (2017.01) |
| *H01L 29/66* | (2006.01) |
| *H01L 29/792* | (2006.01) |
| *H01L 27/06* | (2006.01) |
| *H01L 21/822* | (2006.01) |

(Continued)

(52) U.S. Cl.
CPC .... *H01L 27/11578* (2013.01); *H01L 21/8221* (2013.01); *H01L 27/0688* (2013.01); *H01L 27/1157* (2013.01); *H01L 27/11563* (2013.01); *H01L 27/11565* (2013.01); *H01L 27/11568* (2013.01); *H01L 27/11575* (2013.01); *H01L 27/11582* (2013.01); *H01L 29/66666* (2013.01); *H01L 29/7926* (2013.01)

(58) Field of Classification Search
CPC .......... H01L 27/0688; H01L 27/11514; H01L 27/11521; H01L 27/11551; H01L 27/11556; H01L 27/11568; H01L 27/11575; H01L 27/11578; H01L 27/281; H01L 21/8221
See application file for complete search history.

(56) References Cited

U.S. PATENT DOCUMENTS

| | | |
|---|---|---|
| 7,847,342 B2 | 12/2010 | Fukuzumi et al. |
| 8,394,716 B2 | 3/2013 | Hwang et al. |

(Continued)

FOREIGN PATENT DOCUMENTS

KR    101487746    2/2015

*Primary Examiner* — Eduardo A Rodela
(74) *Attorney, Agent, or Firm* — Sughrue Mion, PLLC

(57) ABSTRACT

A vertical memory device structure can include a vertical channel structure that vertically penetrates through an upper structure and a lower structure of a stack structure in a cell array region of the device. The vertical channel structure can have a side wall with a stepped profile at a level in the vertical channel structure where the upper structure meets the lower structure. A vertical dummy structure can vertically penetrate through a staircase structure that is defined by the upper structure and the lower structure in a connection region of the device, and the vertical dummy structure can have a side wall with a planar profile at the level where the upper structure meets the lower structure.

16 Claims, 27 Drawing Sheets

(51) Int. Cl.
    *H01L 27/11563*    (2017.01)
    *H01L 27/11568*    (2017.01)
    *H01L 27/11565*    (2017.01)
    *H01L 27/1157*     (2017.01)
    *H01L 27/11575*    (2017.01)

(56) References Cited

U.S. PATENT DOCUMENTS

| | | |
|---|---|---|
| 8,877,626 B2 | 11/2014 | Lee et al. |
| 8,969,162 B2 | 3/2015 | Hwang et al. |
| 9,230,987 B2 | 1/2016 | Pachamuthu et al. |
| 9,443,861 B1 | 9/2016 | Pachamuthu et al. |
| 9,536,897 B2 | 1/2017 | Yoo et al. |
| 9,627,403 B2 * | 4/2017 | Liu .................... H01L 27/11582 |
| 2014/0162420 A1 * | 6/2014 | Oh ..................... H01L 27/11565 |
| | | 438/270 |
| 2015/0340376 A1 * | 11/2015 | Park ................. H01L 27/11582 |
| | | 257/329 |
| 2016/0343727 A1 * | 11/2016 | Kim ................. H01L 27/11582 |
| 2017/0179154 A1 * | 6/2017 | Furihata ............ H01L 27/11524 |

\* cited by examiner

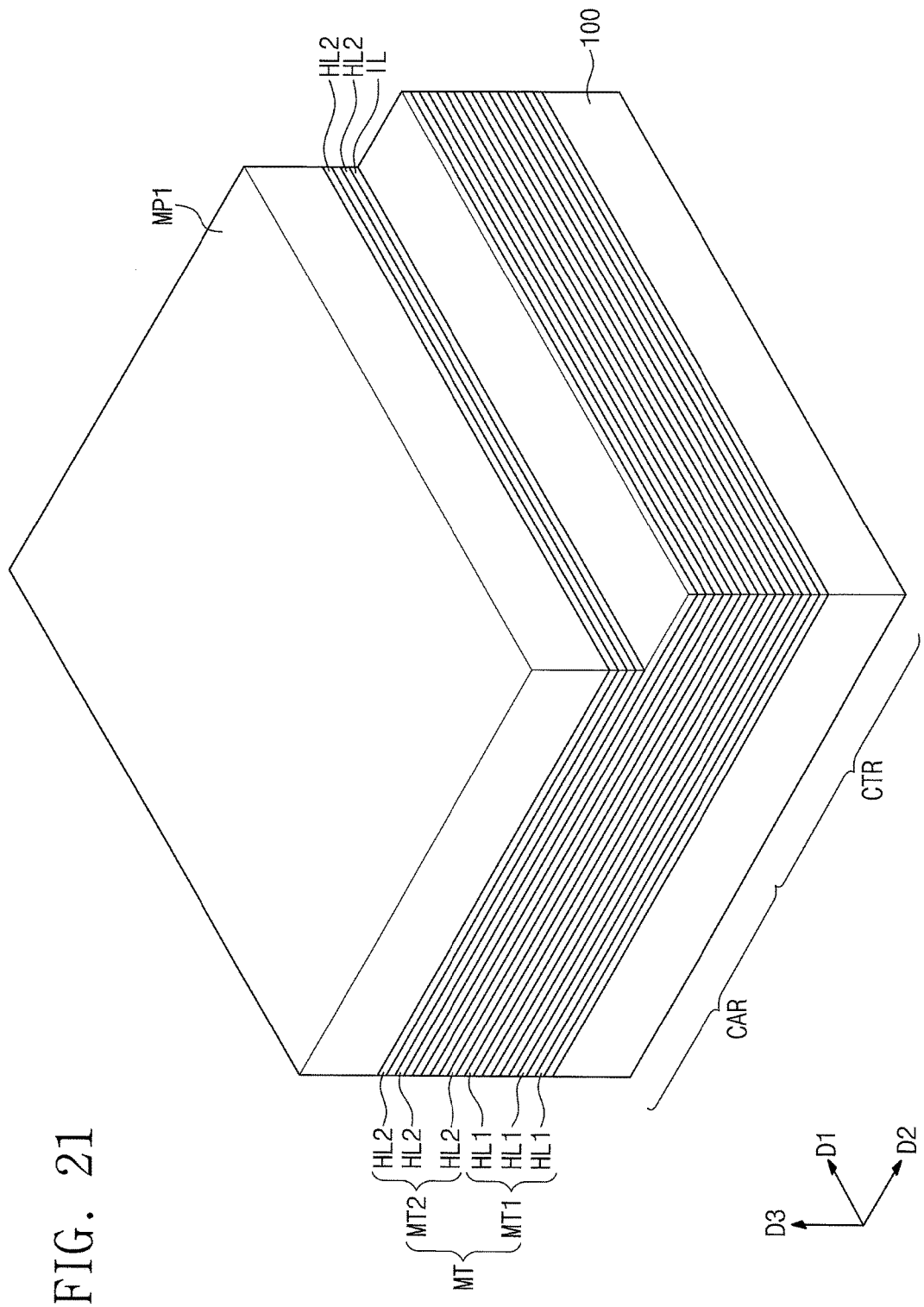

VERTICAL SEMICONDUCTOR MEMORY DEVICE STRUCTURES INCLUDING VERTICAL CHANNEL STRUCTURES AND VERTICAL DUMMY STRUCTURES

CROSS-REFERENCE TO RELATED APPLICATION

This U.S. non-provisional patent application claims priority under 35 U.S.C. § 119 to Korean Patent Application No. 10-2017-0023114, filed on Feb. 21, 2017, in the Korean Intellectual Property Office, the disclosure of which is hereby incorporated by reference in its entirety.

BACKGROUND

Embodiments of the inventive concepts relate to a semiconductor device and a method for manufacturing the same and, more particularly, to a three-dimensional (3D) semiconductor memory device with an improved integration density and a method for manufacturing the same.

The integration density of conventional two-dimensional (2D) or planar semiconductor devices may be determined by an area occupied by a unit memory cell. Therefore, the integration density of the conventional 2D semiconductor devices may be affected by a technique of forming fine patterns. However, since expensive apparatuses may be needed to form fine patterns, the integration density of 2D semiconductor devices continues to increase but may still be limited. Thus, three-dimensional (3D) semiconductor memory devices have been developed to overcome the above limitations. 3D semiconductor memory devices may include memory cells three-dimensionally (i.e., vertically) arranged.

SUMMARY

Embodiments according to the invention can provide vertical semiconductor memory device structures including vertical channel structures and vertical dummy structures and methods of forming the same. Pursuant to these embodiments, a vertical memory device structure can include a vertical channel structure that vertically penetrates through an upper structure and a lower structure of a stack structure in a cell array region of the device. The vertical channel structure can have a side wall with a stepped profile at a level in the vertical channel structure where the upper structure meets the lower structure. A vertical dummy structure can vertically penetrate through a staircase structure that is defined by the upper structure and the lower structure in a connection region of the device, and the vertical dummy structure can have a side wall with a planar profile at the level where the upper structure meets the lower structure.

In some embodiments according to the invention, a vertical memory device structure can include a stack structure including alternating electrode layers and insulating layers extending from a cell array region of the device to a connection region of the device. A lower structure in the stack structure can include an etch stop layer as an uppermost layer in the lower structure and an upper structure in the stack structure on the etch stop layer. A staircase structure can be defined by the upper and lower structures of the stack structure in the connection region.

A vertical channel structure vertically can penetrate through the upper and lower structures of the stack structure in the cell array region, where the vertical channel structure has a side wall with a stepped profile at a level in the vertical channel structure where the upper structure meets the etch stop layer. A vertical dummy structure can vertically penetrate through the staircase structure, where the vertical dummy structure has a side wall with a planar profile at the level in the vertical dummy structure where the upper structure meets the etch stop layer.

In some embodiments according to the invention, a vertical memory device structure can include a stack structure including alternating electrode layers and insulating layers extending from a cell array region of the device to a connection region of the device. A lower structure in the stack structure can include one of the electrode layers or one of the insulating layers as an uppermost layer in the lower structure. An upper structure in the stack structure can be directly on the uppermost layer in the lower structure and a staircase structure can be defined by the upper and lower structures of the stack structure in the connection region.

A vertical channel structure can vertically penetrate through the upper and lower structures of the stack structure in the cell array region, where the vertical channel structure has a side wall with a stepped profile at a level in the vertical channel structure where the upper structure meets the uppermost layer in the lower structure. A vertical dummy structure can vertically penetrate through the staircase structure, where the vertical dummy structure has a side wall with a planar profile at the level in the vertical dummy structure where the upper structure meets the uppermost layer in the lower structure.

In some embodiments according to the invention, a vertical memory device structure can include
a stack structure including alternating electrode layers and insulating layers extending from a cell array region of the device to a connection region of the device, a lower structure in the stack structure, an upper structure on the lower structure, an etch stop layer extending between the upper structure and the lower structure in the cell array region, where the etch stop layer terminates within the cell array region to provide a vertical step height in an uppermost surface of the stack structure in the cell array region and the etch stop layer is absent from between the lower structure and the upper structure in the connection region. A staircase structure can be defined by the upper and lower structures of the stack structure in the connection region. A vertical channel structure can vertically penetrate through the upper structure, the lower structure and the etch stop layer in the cell array region, where the vertical channel structure has a side wall with a stepped profile at a level in the vertical channel structure where the upper structure meets the etch stop layer and a vertical dummy structure can vertically penetrate through the staircase structure, where the vertical dummy structure having a side wall with a planar profile at a level in the vertical dummy structure where the upper structure meets the lower structure.

In some embodiments according to the invention, a method of forming a vertical memory device structure can include forming a lower mold structure on a cell array region of the device and on a connection region of the device. A plurality of lower channel holes can be formed to vertically penetrate through the lower mold structure. An upper mold structure can be formed on the lower mold structure to cover the plurality of lower channel holes. The upper and lower mold structures can be patterned in the connection region to form a staircase structure and a plurality of dummy holes can be formed to vertically penetrate through the staircase structure.

In some embodiments according to the invention, a method of forming a vertical memory device structure can include forming a lower mold structure on a cell array region of the device and on a connection region of the device. An etch stop layer can be formed on the lower mold structure, the etch stop layer can be patterned, a plurality of lower channel holes can be formed to vertically penetrate through the patterned etch stop layer and the lower mold structure. A sacrificial material can be formed in the plurality of lower channel holes and an upper mold structure can be formed on the etch stop layer to cover the sacrificial material in plurality of lower channel holes. The upper and lower mold structures can be patterned in the connection region to form a staircase structure that includes the upper and lower mold structures in the connection region. A plurality of dummy holes can be formed to vertically penetrate through the staircase structure. A plurality of upper channel holes can be formed to expose the sacrificial material in the plurality of lower channel holes. The sacrificial material can be removed from the plurality of lower channel holes to form a plurality of vertical channel holes and a respective vertical channel structure can be formed in each of the plurality of vertical channel holes and forming a respective dummy structure in each of the plurality of dummy holes.

In some embodiments according to the invention, a method of forming a vertical memory device structure can include forming a lower mold structure on a cell array region of the device and on a connection region of the device. A plurality of lower channel holes can be formed to vertically penetrate through the lower mold structure. Sacrificial material can be formed in the plurality of lower channel holes and an upper mold structure can be formed directly on the lower mold structure to cover the sacrificial material in plurality of lower channel holes. The upper and lower mold structures can be patterned in the connection region to form a staircase structure that includes the upper and lower mold structures in the connection region. A plurality of dummy holes can be formed to vertically penetrate through the staircase structure and a plurality of upper channel holes to expose the sacrificial material in the plurality of lower channel holes. The sacrificial material can be removed from the plurality of lower channel holes to form a plurality of vertical channel holes. A respective vertical channel structure can be formed in each of the plurality of vertical channel holes and forming a respective dummy structure in each of the plurality of dummy holes.

In some embodiments according to the invention, a method of forming a vertical memory device structure can include forming a lower mold structure on a cell array region of the device and on a connection region of the device. An etch stop layer can be formed to cover the lower mold structure in the cell array region. The etch stop layer can be patterned and a plurality of lower channel holes can be formed to vertically penetrate through the patterned etch stop layer and the lower mold structure in the cell array region. Sacrificial material can be formed in the plurality of lower channel holes and an upper mold structure can be formed on the etch stop layer to cover the sacrificial material in plurality of lower channel holes to form a vertical step height in an uppermost surface of the upper mold structure aligned to where the etch stop layer terminates in the cell array region. The upper and lower mold structures can be patterned to form a staircase structure that includes the upper and lower mold structures in the connection region. A plurality of dummy holes can be formed to vertically penetrate through the staircase structure. A plurality of upper channel holes can be formed to expose the sacrificial material in the plurality of lower channel holes. The sacrificial material can be removed from the plurality of lower channel holes to form a plurality of vertical channel holes and a respective vertical channel structure can be formed in each of the plurality of vertical channel holes and a respective dummy structure can be formed in each of the plurality of dummy holes.

BRIEF DESCRIPTION OF THE DRAWINGS

The inventive concepts will become more apparent in view of the attached drawings and accompanying detailed description.

FIGS. 21 to 24 are perspective views illustrating a method for manufacturing a 3D semiconductor memory device, according to some embodiments of the inventive concepts.

DETAILED DESCRIPTION OF THE EMBODIMENTS

Figure 1:
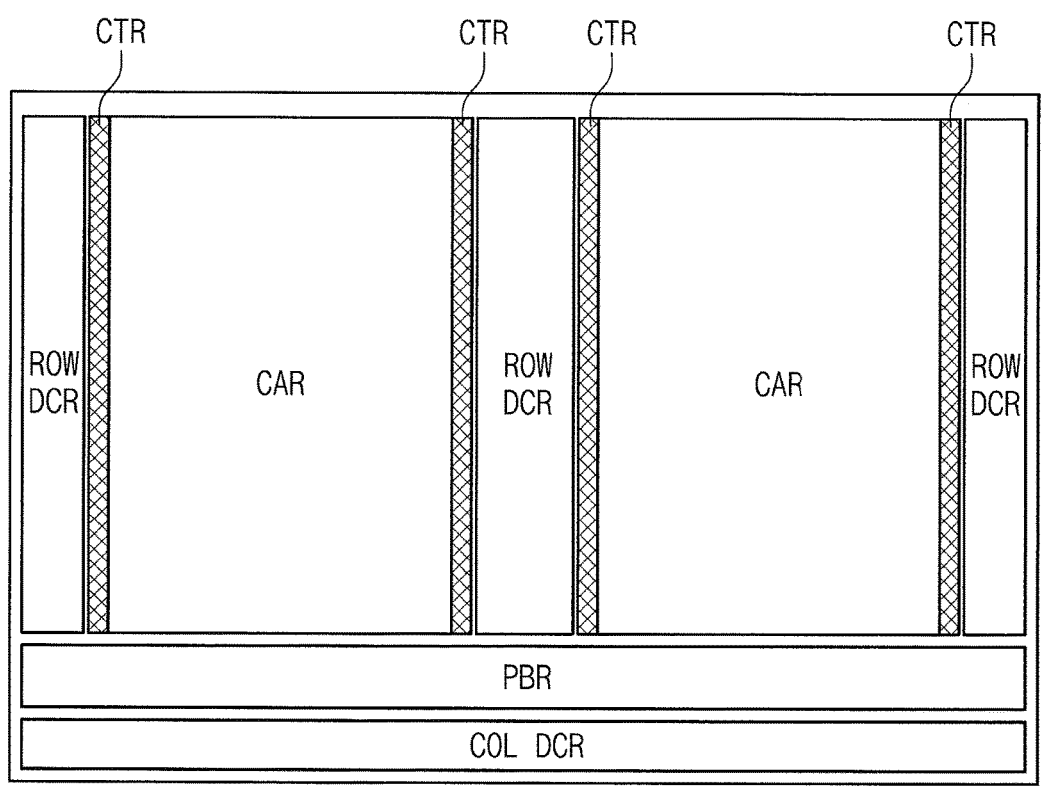
FIG. 1 is a schematic block diagram illustrating a three-dimensional (3D) semiconductor memory device according to some embodiments of the inventive concepts.

FIG. 1 is a schematic block diagram illustrating a three-dimensional (3D) semiconductor memory device according to some embodiments of the inventive concepts.

Referring to FIG. 1, a 3D semiconductor memory device (sometimes referred to as a vertical memory device structure) may include a cell array region CAR and a peripheral circuit region. The peripheral circuit region may include row decoder regions ROW DCR, a page buffer region PBR, a column decoder region COL DCR, and a control circuit region. In some embodiments, a connection region CTR may be disposed between the cell array region CAR and the row decoder region ROW DCR.

A memory cell array (or a cell array) including a plurality of memory cells may be disposed in the cell array region CAR. In some embodiments, the memory cell array may include three-dimensionally arranged memory cells, word lines, and bit lines. The word lines and the bit lines may be electrically connected to the memory cells.

A row decoder for selecting the word lines of the memory cell array may be disposed in the row decoder region ROW DCR, and an interconnection structure for electrically connecting the memory cell array to the row decoder may be disposed in the connection region CTR. The row decoder may select one among the word lines of the memory cell array in response to an address signal. The row decoder may respectively provide a first word line voltage and second word line voltages to the selected word line and unselected word lines in response to a control signal of a control circuit.

A page buffer for sensing data stored in the memory cells may be disposed in the page buffer region PBR. In operation, the page buffer may temporarily store data to be stored in the memory cells or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 2:
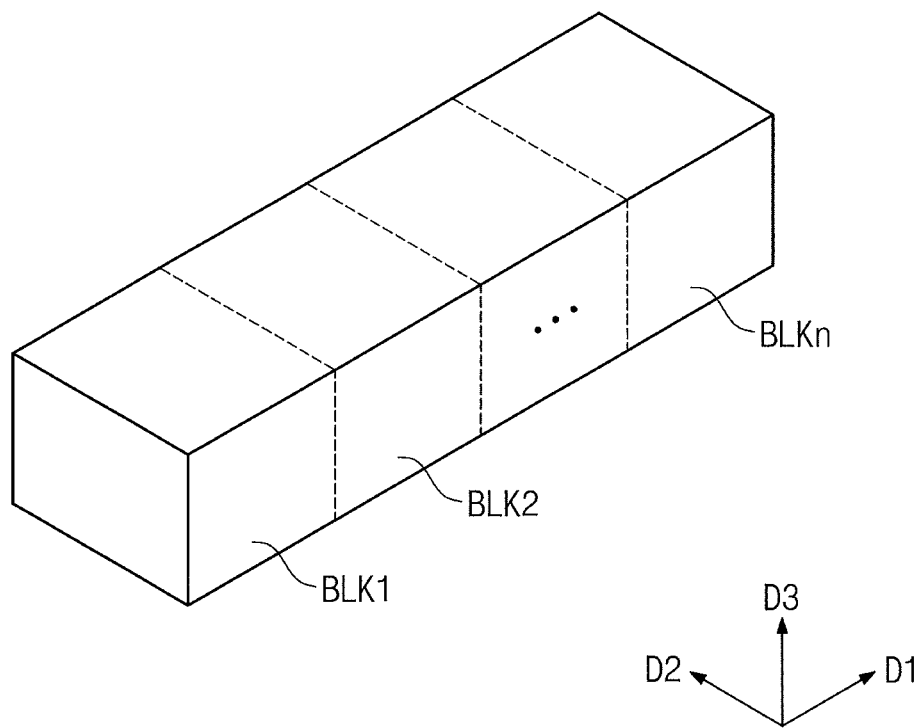
FIG. 2 is a schematic block diagram illustrating a cell array of a 3D semiconductor memory device according to some embodiments of the inventive concepts.

FIG. 2 is a schematic block diagram illustrating a cell array of a 3D semiconductor memory device according to some embodiments of the inventive concepts.

Referring to FIG. 2, a cell array in a cell array region CAR may include a plurality of cell array blocks BLK1 to BLKn. Each of the cell array blocks BLK1 to BLKn may include a stack structure that includes electrodes stacked in a third direction D3 on a plane defined by first and second directions D1 and D2. The stack structure may be coupled to a plurality of vertical structures (e.g., semiconductor pillars) to constitute memory cells three-dimensionally arranged. In addition, each of the cell array blocks BLK1 to BLKn may further include bit lines electrically connected to the memory cells.

Figure 3:
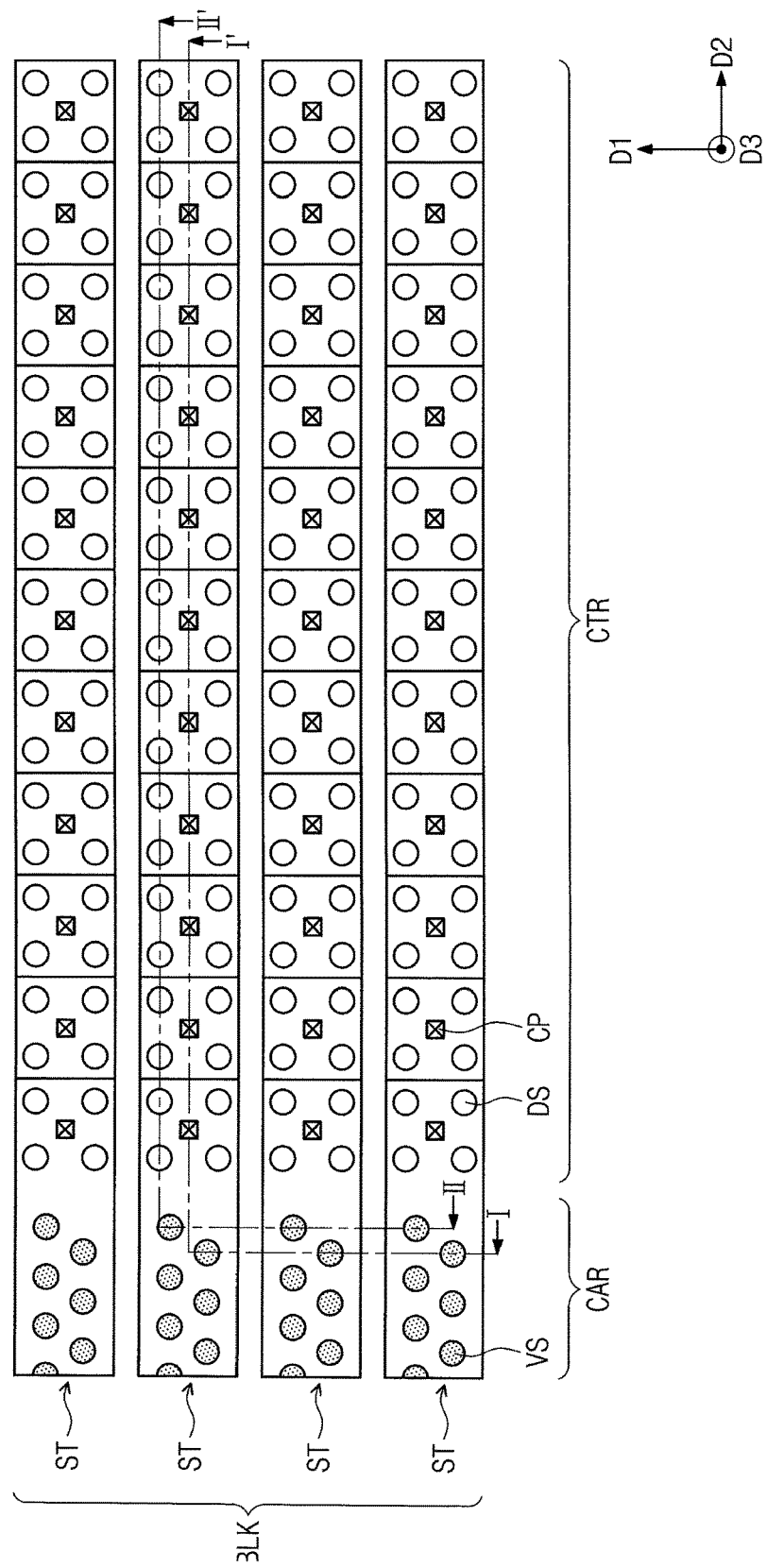
FIG. 3 is a plan view illustrating a 3D semiconductor memory device according to some embodiments of the inventive concepts.
Figure 4A:
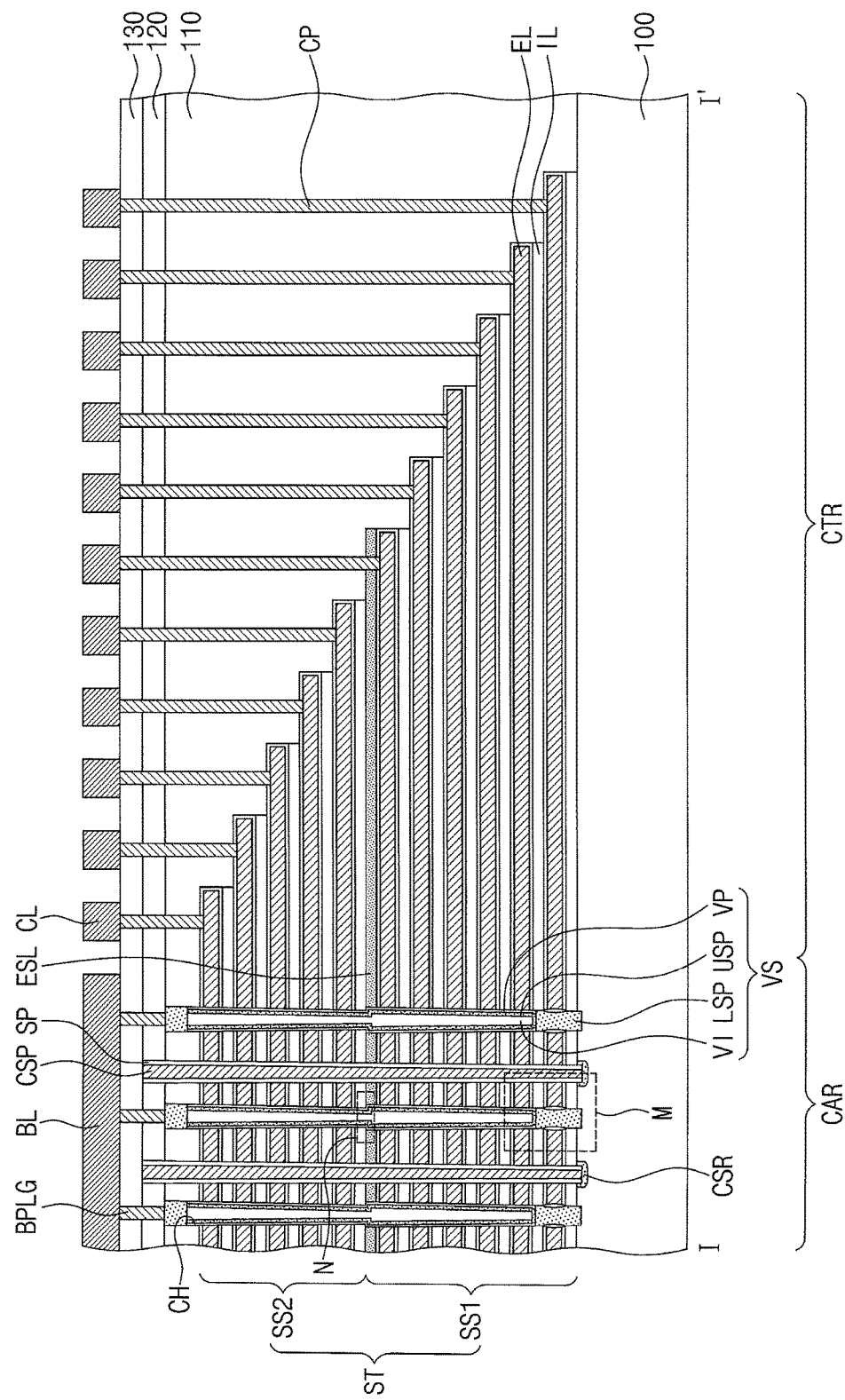
FIGS. 4A and 4B are cross-sectional views taken along lines I-I' and II-II' of FIG. 3, respectively.
Figure 4B:
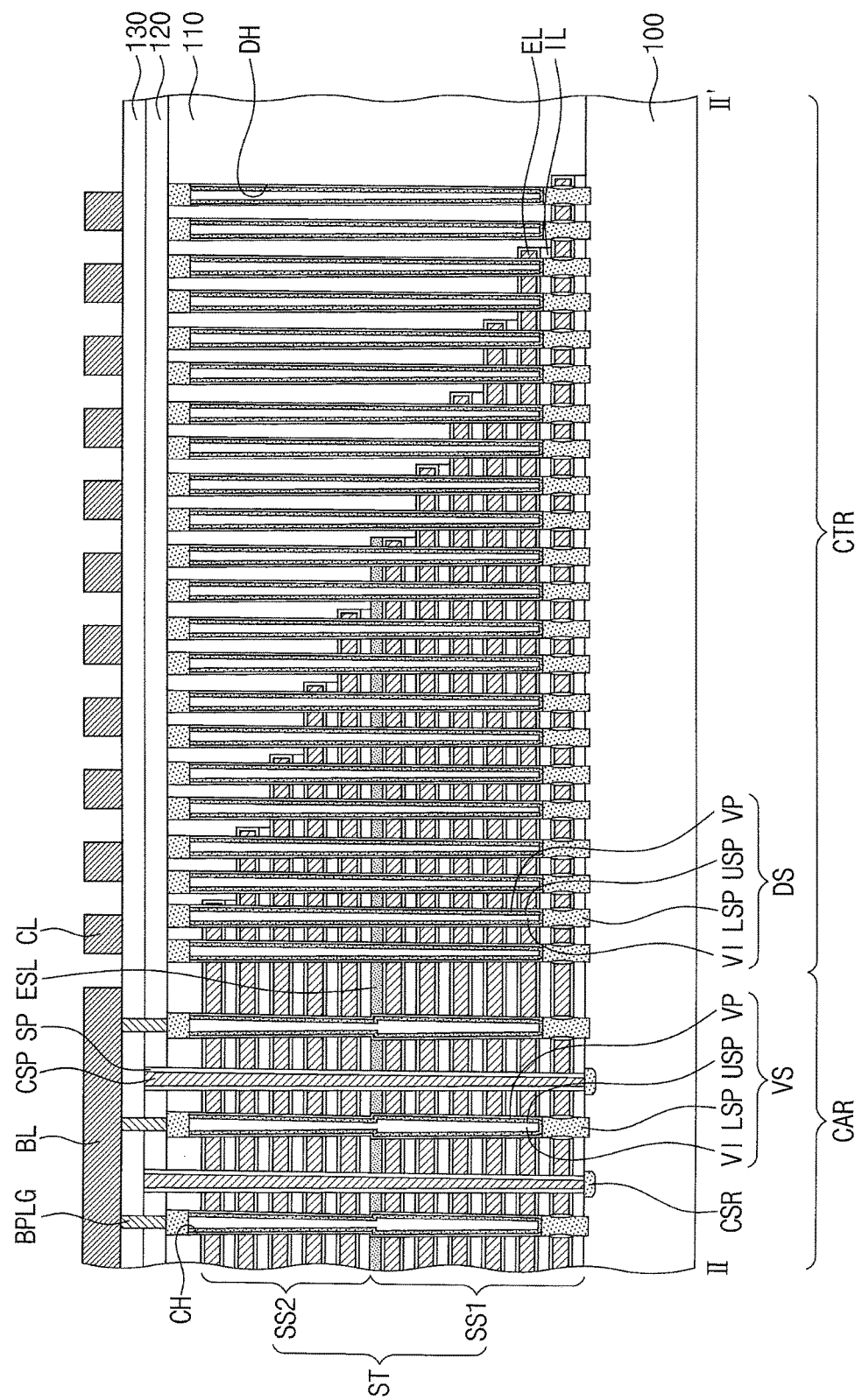
Figure 5A:
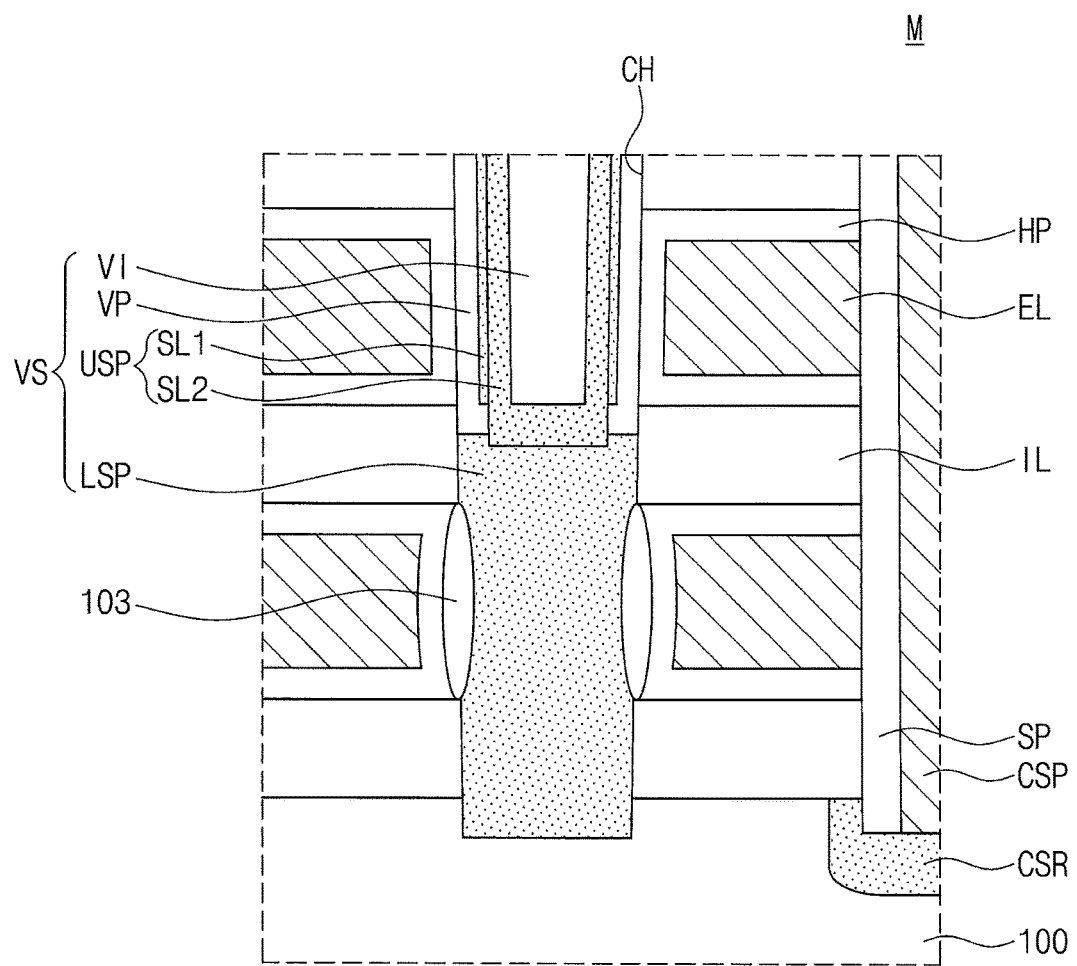
FIGS. 5A and 5B are enlarged cross-sectional views of regions 'M' and 'N' of FIG. 4A, respectively.
Figure 5B:
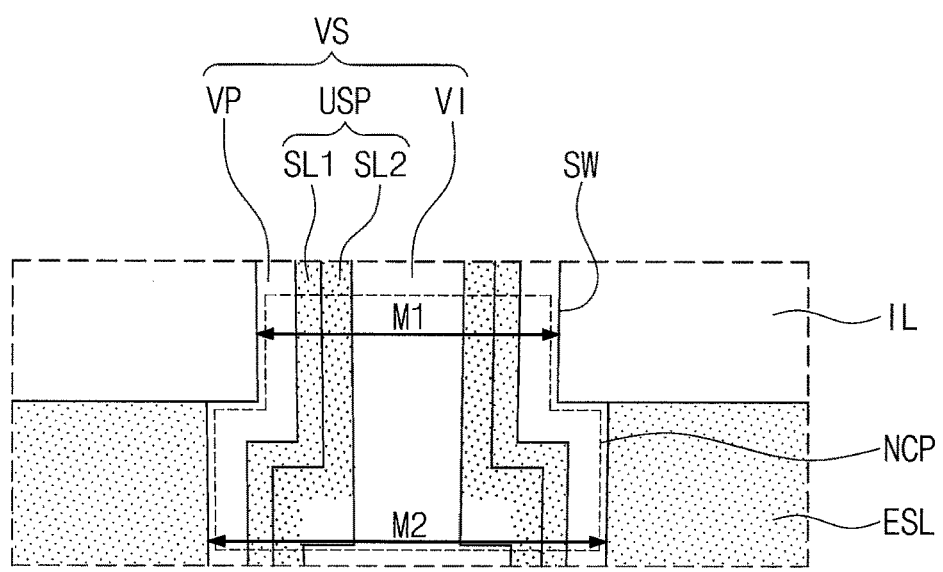
Figure 5C:
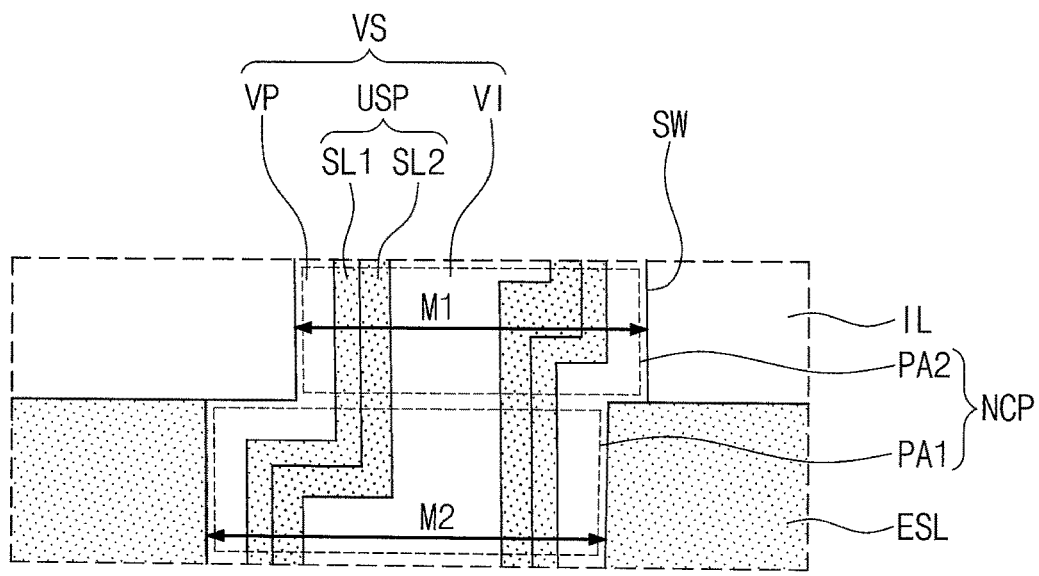
FIG. 5C is an enlarged cross-sectional view corresponding to the region 'N' of FIG. 4A to illustrate a 3D semiconductor memory device according to some embodiments of the inventive concepts.

FIG. 3 is a plan view illustrating a 3D semiconductor memory device according to some embodiments of the inventive concepts. FIGS. 4A and 4B are cross-sectional views taken along lines I-I' and II-II' of FIG. 3, respectively. FIGS. 5A and 5B are enlarged cross-sectional views of regions 'M' and 'N' of FIG. 4A, respectively. FIG. 5C is an enlarged cross-sectional view corresponding to the region 'N' of FIG. 4A to illustrate a 3D semiconductor memory device according to some embodiments of the inventive concepts.

Referring to FIGS. 3, 4A, 4B, 5A, 5B, and 5C, a substrate 100 may be provided. The substrate 100 may include a cell array region CAR and a connection region CTR. For example, the substrate 100 may be a silicon substrate, a germanium substrate, or a silicon-germanium substrate. The substrate 100 may have a first conductivity type, e.g., a P-type.

A cell array block BLK may be disposed on the substrate 100. The cell array block BLK may include stack structures ST, each of which includes insulating layers IL and electrodes layers EL which are vertically alternately stacked (sometimes referred to as alternating electrode layers and insulating layers). Each of the stack structures ST may include a lower structure SS1 and an upper structure SS2. The upper structure SS2 may be disposed on the lower structure SS1. The stack structures ST may extend from the cell array region CAR onto the connection region CTR in a second direction D2. The stack structures ST may be arranged in a first direction D1 intersecting the second direction D2. Although an upper structure and a lower structure are shown in the figures, it will be understood that one or more intermediate structures can be provided between the upper and lower structures where the each intermediate structure can include the same components included in the upper and lower structures.

Common source regions CSR may be provided in the cell array region CAR. Each of the common source regions CSR may be disposed in the substrate 100 between the stack structures ST laterally adjacent to each other. The common source regions CSR may extend in parallel to the stack structures ST in the second direction D2. The common source regions CSR may be arranged in the first direction D1. The common source regions CSR may be doped with dopants and may have a second conductivity type. For example, the common source regions CSR may be doped with dopants such as arsenic (As) or phosphorus (P) and may have an N-type.

A common source plug CSP may be connected to the common source region CSR. The common source plug CSP may extend in parallel to the stack structures ST in the second direction D2. Insulating spacers SP may be disposed between the common source plug CSP and the stack structures ST, respectively.

The electrodes EL of each of the stack structures ST may be stacked along a third direction D3 substantially perpendicular to a top surface of the substrate 100. The electrodes EL may be vertically isolated from each other by the insulating layers IL disposed therebetween. The electrodes EL may have a staircase structure on the connection region CTR. In other words, a height of the stack structure ST on the connection region CTR may decrease stepwise as a horizontal distance from the cell array region CAR increases.

The lowest electrode EL of the lower structure SS1 may be a lower selection line. The uppermost electrode EL of the upper structure SS2 may be an upper selection line. The other electrodes EL of the lower and upper structures SS1 and SS2 except the lower and upper selection lines may correspond to word lines. An etch stop layer ESL may be provided at the uppermost layer of the lower structure SS1. In other words, the uppermost layer of the lower structure SS1 may correspond to the etch stop layer ESL. The etch stop layer ESL may be in direct contact with the lowest insulating layer IL of the upper structure SS2. It will be understood that in some embodiments according to the invention, the lowest layer in the stack structure can be either an electrode layer or an insulating layer.

For example, the electrodes EL may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). For example, each of the insulating layers IL may include a silicon oxide layer. For example, the etch stop layer ESL may include a poly-silicon layer.

Planar areas of the electrodes EL on the connection region CTR may increase sequentially as a distance from the top surface of the substrate 100 in the third direction D3 increases. The lowest electrode EL (e.g., the lower selection line) of the stack structure ST may have the largest planar area. The uppermost electrode EL (e.g., the upper selection line) of the stack structure ST may have the smallest planar area.

A plurality of vertical channel holes CH may penetrate each of the stack structures ST on the cell array region CAR. A vertical structure VS (sometimes referred to as a vertical channel structure) may be provided in each of the channel holes CH. The vertical structures VS of each of the stack structures ST may be arranged in the second direction D2 when viewed in a plan view. For example, the vertical structures VS of each of the stack structures ST may be arranged in a zigzag form along the second direction D2. In certain embodiments the vertical structures VS of each of the stack structures ST may be arranged in a line along the second direction D2.

Each of the vertical structures VS may include a vertical insulating layer VP, an upper semiconductor pattern USP, a lower semiconductor pattern LSP, and a filling insulation pattern VI. The vertical insulating layer VP may extend toward the substrate 100 along an inner side wall of the channel hole CH. The upper semiconductor pattern USP may cover an inner side wall of the vertical insulating layer VP and may extend together with the vertical insulating layer VP toward the substrate 100.

Referring again to FIG. 5A, the lower semiconductor pattern LSP may be provided in a lower region of the channel hole CH and may be in direct contact with the substrate 100. The lower semiconductor pattern LSP may penetrate the lowest electrode EL (e.g., the lower selection line) of the stack structure ST. An oxide pattern 103 may be disposed between the lower semiconductor pattern LSP and the lowest electrode EL (e.g., the lower selection line). The upper semiconductor pattern USP may include a first semiconductor pattern SL1 and a second semiconductor pattern SL2. The second semiconductor pattern SL2 may be connected directly to the lower semiconductor pattern LSP. The second semiconductor pattern SL2 may have a pipe or macaroni shape of which a bottom end contacting the lower semiconductor pattern LSP is closed. An inner space of the second semiconductor pattern SL2 may be filled with the filling insulation pattern VI. The second semiconductor pattern SL2 may be in contact with an inner side wall of the first semiconductor pattern SL1. The second semiconductor pattern SL2 may electrically connect the first semiconductor pattern SL1 to the lower semiconductor pattern LSP. The first semiconductor pattern SL1 may have a pipe or macaroni shape of which top and bottom ends are opened. The first semiconductor pattern SL1 may not be in contact with the lower semiconductor pattern LSP but may be spaced apart from the lower semiconductor pattern LSP. The lower and upper semiconductor patterns LSP and USP may be used as channel regions of the 3D semiconductor memory device according to some embodiments of the inventive concepts.

In some embodiments, the lower and upper semiconductor patterns LSP and USP may include silicon (Si), germanium (Ge), or a mixture thereof and may have crystal structures different from each other. Each of the lower and upper semiconductor patterns LSP and USP may have a crystal structure including at least one of a single-crystalline structure, an amorphous structure, or a poly-crystalline structure. The lower and upper semiconductor patterns LSP and USP may be undoped or may be doped with dopants having the same conductivity type (i.e., the first conductivity type) as the substrate 100.

Referring again to FIGS. 3, 4A, and 4B, a diameter of the vertical structure VS in the lower structure SS1 may become progressively less toward the substrate 100. A diameter of the vertical structure VS in the upper structure SS2 may become progressively less toward the substrate 100. The diameter of the vertical structure VS may be sharply changed in a region between the lower structure SS1 and the upper structure SS2.

Referring again to FIG. 5B, the vertical structure VS may include at least one portion NCP. The portion NCP may be disposed between the lower structure SS1 and the upper structure SS2. The etch stop layer ESL may be adjacent to the portion NCP. The etch stop layer ESL may be disposed at a substantially the same level as the portion NCP.

An upper portion of the portion NCP may have a first diameter M1, and a lower portion of the portion NCP may have a second diameter M2. The diameter of the portion NCP may increase ly (sharply) at an interface the upper structure SS2 and the lower structure SS1. Thus, the second diameter M2 may be greater than the first diameter M1. Accordingly, a side wall SW of the vertical structure VS may have a stepped profile at the portion NCP.

Horizontal insulating layers HP may be disposed between the vertical structure VS and the electrodes EL, respectively. The horizontal insulating layer HP and the vertical insulating layer VP, which are disposed between the electrode EL and the upper semiconductor pattern USP, may constitute a data storage layer.

In some embodiments, the 3D semiconductor memory device according to some embodiments of the inventive concepts may be an NAND flash memory device. For example, the data storage layer between the electrode EL and the upper semiconductor pattern USP may include a tunnel insulating layer, a charge storage layer, and a blocking insulating layer. The tunnel insulating layer may be in direct contact with the upper semiconductor pattern USP. The blocking insulating layer may be in direct contact with the electrode EL. The charge storage layer may be disposed between the tunnel insulating layer and the blocking insulating layer. Data stored in the data storage layer may be changed using a Fowler-Nordheim tunneling effect induced by a difference in voltage between the electrode EL and the upper semiconductor pattern USP.

The tunnel insulating layer may include a material of which an energy band gap is greater than that of the charge storage layer. For example, the tunnel insulating layer may include at least one of a high-k dielectric layer (e.g., an aluminum oxide layer or a hafnium oxide layer) or a silicon oxide layer. The charge storage layer may include a silicon nitride layer, a silicon oxynitride layer, or a silicon-rich nitride layer. The blocking insulating layer may include at least one of a high-k dielectric layer (e.g., an aluminum oxide layer or a hafnium oxide layer) or a silicon oxide layer.

An embodiment different from the embodiment of FIG. 5B will be described with reference to FIG. 5C. Referring to FIG. 5C, an upper portion PA2 of the portion NCP of the vertical structure VS may be misaligned with a lower portion PA1 of the portion NCP. A center of the upper portion PA2 of the portion NCP may be laterally shifted from a center of the lower portion PA1 of the portion NCP when viewed in a plan view. The upper portion PA2 of the portion NCP may be provided in the upper structure SS2, and the lower portion PA1 of the portion NCP may be provided in the lower structure SS1.

The diameter of the portion NCP may increase sharply at an interface of the upper structure SS2 and the lower structure SS1. In more detail, the upper portion PA2 of the portion NCP may have a first diameter M1, and the lower portion PA1 of the portion NCP may have a second diameter M2. The second diameter M2 may be greater than the first diameter M1. A side wall SW of the vertical structure VS may have a stepped profile.

Referring again to FIGS. 3, 4A, and 4B, contact plugs CP may be connected to the electrodes EL of the stack structure ST on the connection region CTR. In some embodiments, the number of the contact plugs CP connected to the stack structure ST may be equal to the number of the electrodes EL included in the stack structure ST. The contact plugs CP may be spaced apart from each other and may be arranged in the second direction D2. Since the electrodes EL are arranged in a staircase structure on the connection region CTR, bottom surfaces of the contact plugs CP may be disposed at different heights (or levels) from the substrate 100. The levels of the bottom surfaces of the contact plugs CP from the substrate 100 may decrease sequentially as a horizontal distance from the cell array region CAR increases.

A plurality of dummy holes DH may penetrate a filling insulation layer 110 and the stack structure ST on the connection region CTR. A dummy structure (sometimes referred to as a vertical dummy structure) DS may be provided in each of the dummy holes DH, respectively. The dummy structures DS may be provided on the connection region CTR but may not be provided on the cell array region CAR. The dummy structures DS may be adjacent to the contact plugs CP but may be spaced apart from the contact plugs CP.

The dummy structures DS may physically support the stack structure ST on the connection region CTR. In some embodiments, each of the dummy structures DS may include a vertical insulating layer VP, an upper semiconductor pattern USP, a lower semiconductor pattern LSP, and a filling insulation pattern VI, like the vertical structure VS (i.e., the vertical dummy structures and the vertical channel structures may include the identical layers in some embodiments).

A diameter of the dummy structure DS may become progressively less toward the substrate 100. The diameter of the dummy structure DS may become continuously less from the upper structure SS2 to the lower structure SS1. In other words, unlike the vertical structure VS described above, the diameter of the dummy structure DS may not be sharply changed, rather a side wall of the dummy structure DS may have a planar profile.

In some embodiments, the maximum diameter of the dummy structure DS may be substantially equal to the maximum diameter of the vertical structure VS. In certain embodiments, the maximum diameter of the dummy structure DS may be greater than the maximum diameter of the vertical structure VS.

The filling insulation layer 110 may be disposed on the substrate 100 and may cover the stack structures ST. The filling insulation layer 110 may have a planarized top surface. A vertical thickness of the filling insulation layer 110 may increase as a horizontal distance from the cell array region CAR increases.

A first interlayer insulating layer 120 and a second interlayer insulating layer 130 may be sequentially stacked on the filling insulation layer 110. Bit lines BL may be disposed on the second interlayer insulating layer 130 and may extend in the first direction D1 to intersect the stack structures ST. The bit lines BL may be electrically connected to the vertical structures VS through bit line contact plugs BPLG. Interconnection lines CL may be disposed on the second interlayer insulating layer 130 so as to be connected to the contact plugs CP. The dummy structures DS may be electrically insulated from both the bit lines BL and the interconnection lines CL.

FIGS. 6 to 13 are cross-sectional views taken along the line II-II' of FIG. 3 to illustrate a method for manufacturing a 3D semiconductor memory device, according to some embodiments of the inventive concepts.

Figure 6:
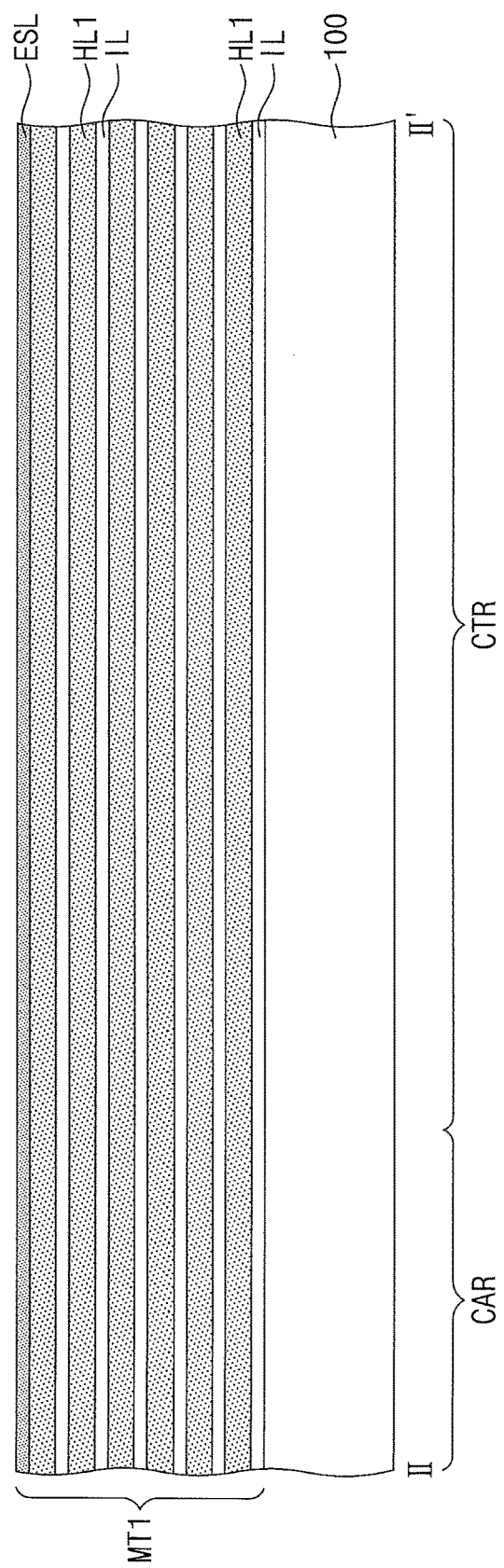
FIGS. 6 to 13 are cross-sectional views taken along the line II-II' of FIG. 3 to illustrate a method for manufacturing a 3D semiconductor memory device, according to some embodiments of the inventive concepts.

Referring to FIGS. 3 and 6, insulating layers IL and first sacrificial layers HL1 may be vertically and alternately stacked on an entire top surface of a substrate 100 to form a lower mold structure MT1. The substrate 100 may include a cell array region CAR and a connection region CTR. An etch stop layer ESL may be formed on the uppermost one of the first sacrificial layers HL1. For example, the substrate 100 may be a silicon substrate, a germanium substrate, or a silicon-germanium substrate.

The insulating layers IL, the first sacrificial layers HL1, and the etch stop layer ESL may be deposited using a thermal chemical vapor deposition (thermal CVD) process, a plasma-enhanced CVD process, a physical CVD process, and/or an atomic layer deposition (ALD) process. For example, each of the insulating layers IL may be formed of a silicon oxide layer, and each of the first sacrificial layers may be formed of a silicon nitride layer or a silicon oxynitride layer. The etch stop layer ESL may be formed of a poly-silicon layer.

Figure 7:
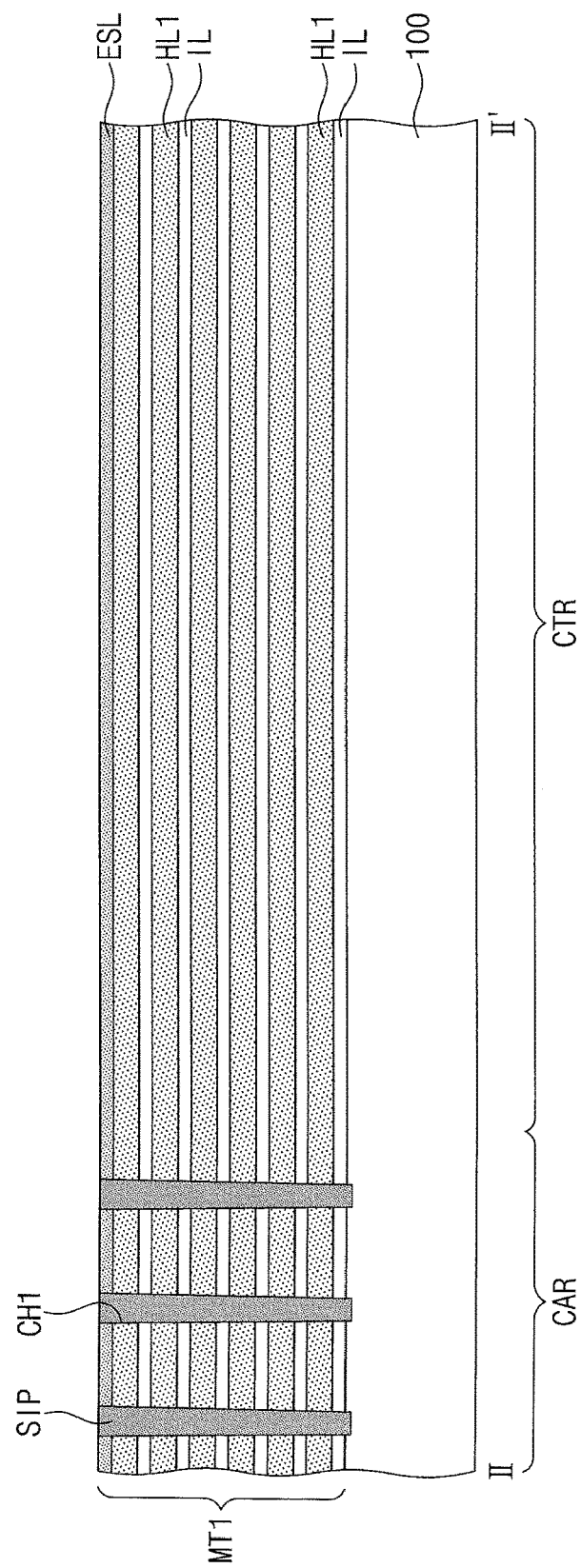

Referring to FIGS. 3 and 7, first channel holes (sometimes referred to as lower channel holes) CH1 may be formed to penetrate the lower mold structure MT1 on the cell array region CAR. The first channel holes CH1 may expose the substrate 100. A diameter of the first channel hole CH1 may become progressively less toward the substrate 100.

In more detail, the formation of the first channel holes CH1 may include forming a mask pattern having openings defining the first channel holes CH1 on the lower mold structure MT1, and etching the lower mold structure MT1 using the mask pattern as an etch mask. Thereafter, the mask pattern may be removed. On the other hand, a top surface of the substrate 100 under the first channel holes CH1 may be over-etched during the etching process. Thus, an upper portion of the substrate 100 under the first channel holes CH1 may be recessed.

Sacrificial insulating patterns (sometimes referred to as sacrificial material) SIP may fill the first channel holes CH1, respectively. A sacrificial insulating layer may be formed on the lower mold structure MT1 to fill the first channel holes CH1, and the sacrificial insulating layer may be planarized until a top surface of the etch stop layer ESL is exposed, thereby forming the sacrificial insulating patterns SIP.

Figure 8:
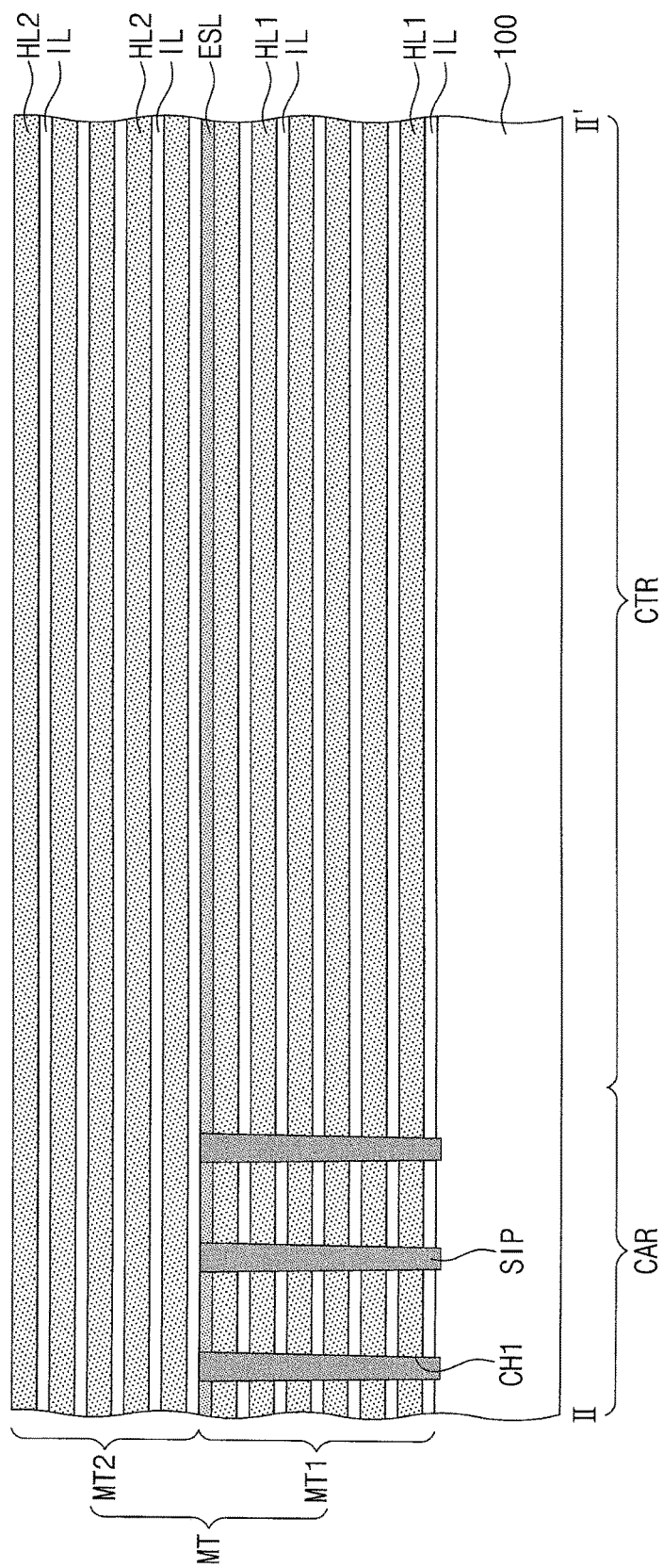

Referring to FIGS. 3 and 8, insulating layers IL and second sacrificial layers HL2 may be vertically and alternately stacked on the lower mold structure MT1 to form an upper mold structure MT2. The lower mold structure MT1 and the upper mold structure MT2 may constitute a mold structure MT. The insulating layers IL and the second sacrificial layers HL2 of the upper mold structure MT2 may be formed by substantially the same method as the insulating layers IL and the first sacrificial layers HL1 of the lower mold structure MT1.

Figure 9:
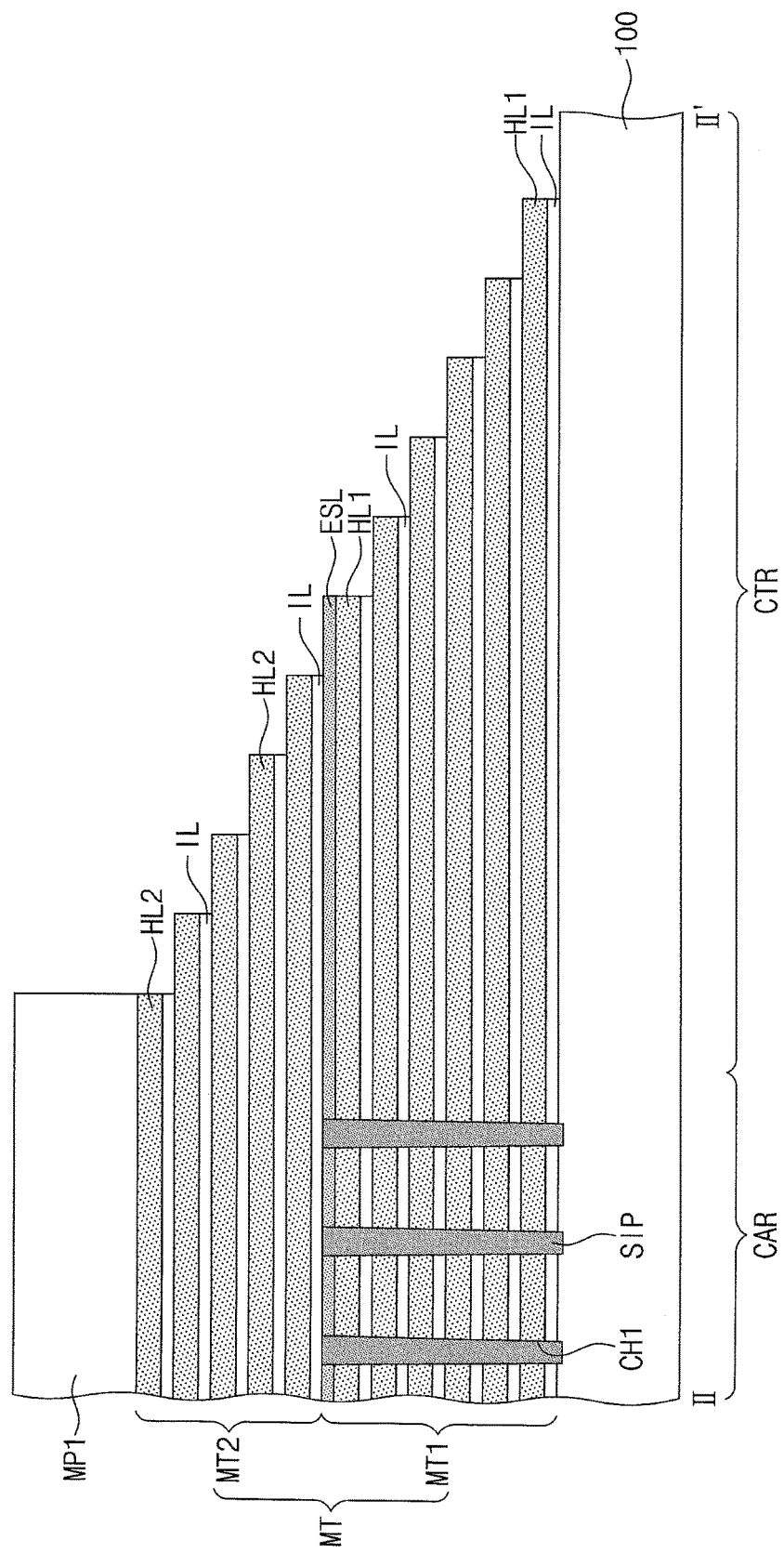

Referring to FIGS. 3 and 9, the mold structure MT disposed on the connection region CTR may be formed into a staircase structure. In more detail, a first mask pattern MP1 may be formed on the mold structure MT. The first mask pattern MP1 may expose a portion of the mold structure MT disposed on the connection region CTR. Next, a process of etching a portion of the mold structure MT by using the first mask pattern MP1 as an etch mask and a trimming process of shrinking the first mask pattern MP1 may be alternately repeated. A plurality of the sacrificial layers HL1 and HL2 exposed by the first mask pattern MP1 may be etched by the process of etching the portion of the mold structure MT. An etch depth in the etching process may correspond to a vertical pitch of the sacrificial layers HL1 and HL2 vertically stacked. A side wall of the first mask pattern MP1 may be laterally shifted by a specific distance during the trimming process, and thus an area of the first mask pattern MP1 may be reduced.

Figure 10:
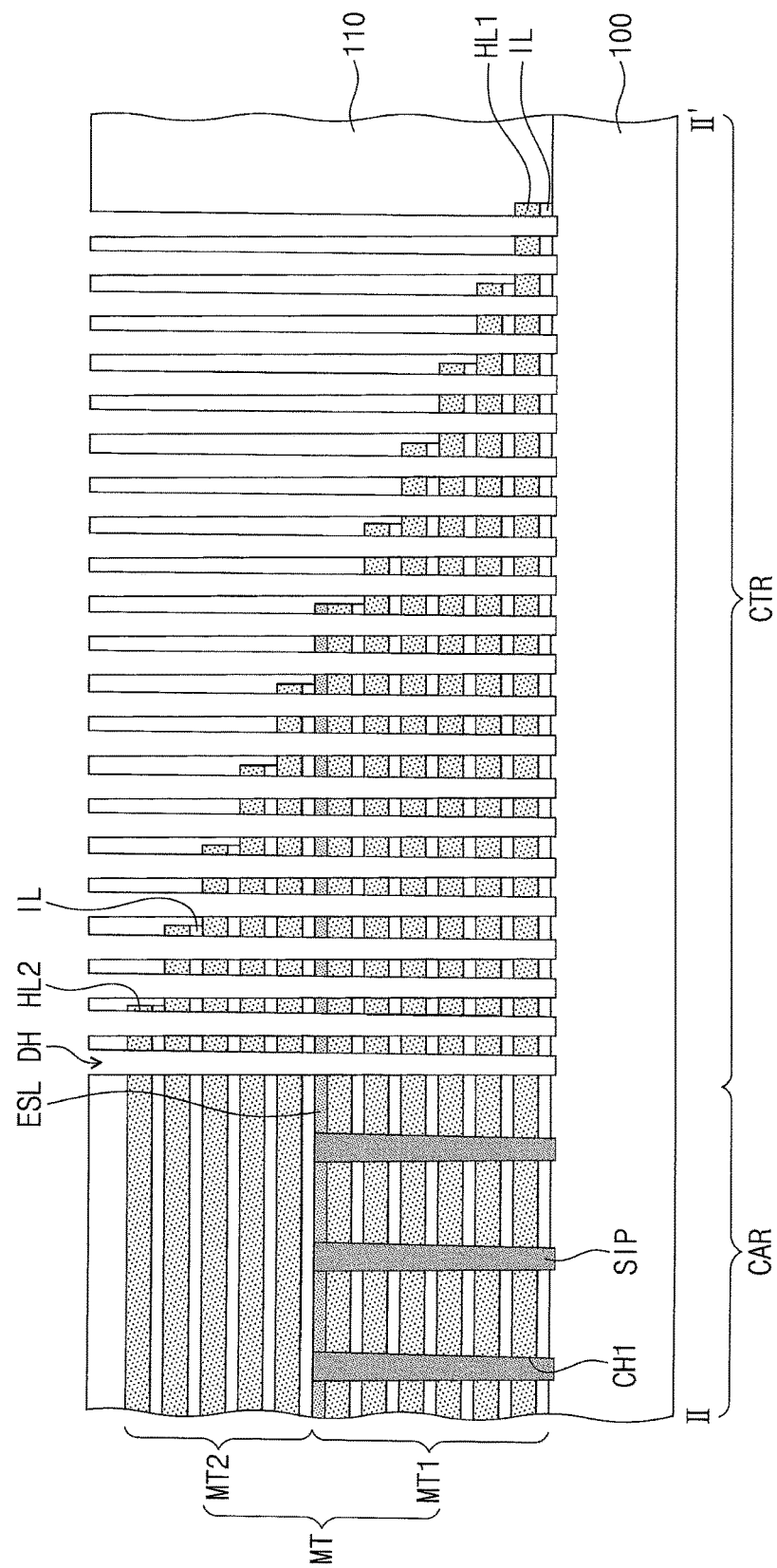

Referring to FIGS. 3 and 10, a filling insulation layer 110 may be formed on an entire top surface of the substrate 100 to cover the mold structure MT. The first mask pattern MP1 may be removed before the formation of the filling insulation layer 110. A plurality of dummy holes DH may be formed to penetrate the filling insulation layer 110 and the mold structure MT on the connection region CTR. A diameter of each of the dummy holes DH may become progressively less toward the substrate 100. A method of forming the dummy holes DH may be substantially similar to the method of forming the first channel holes CH1.

Figure 11:
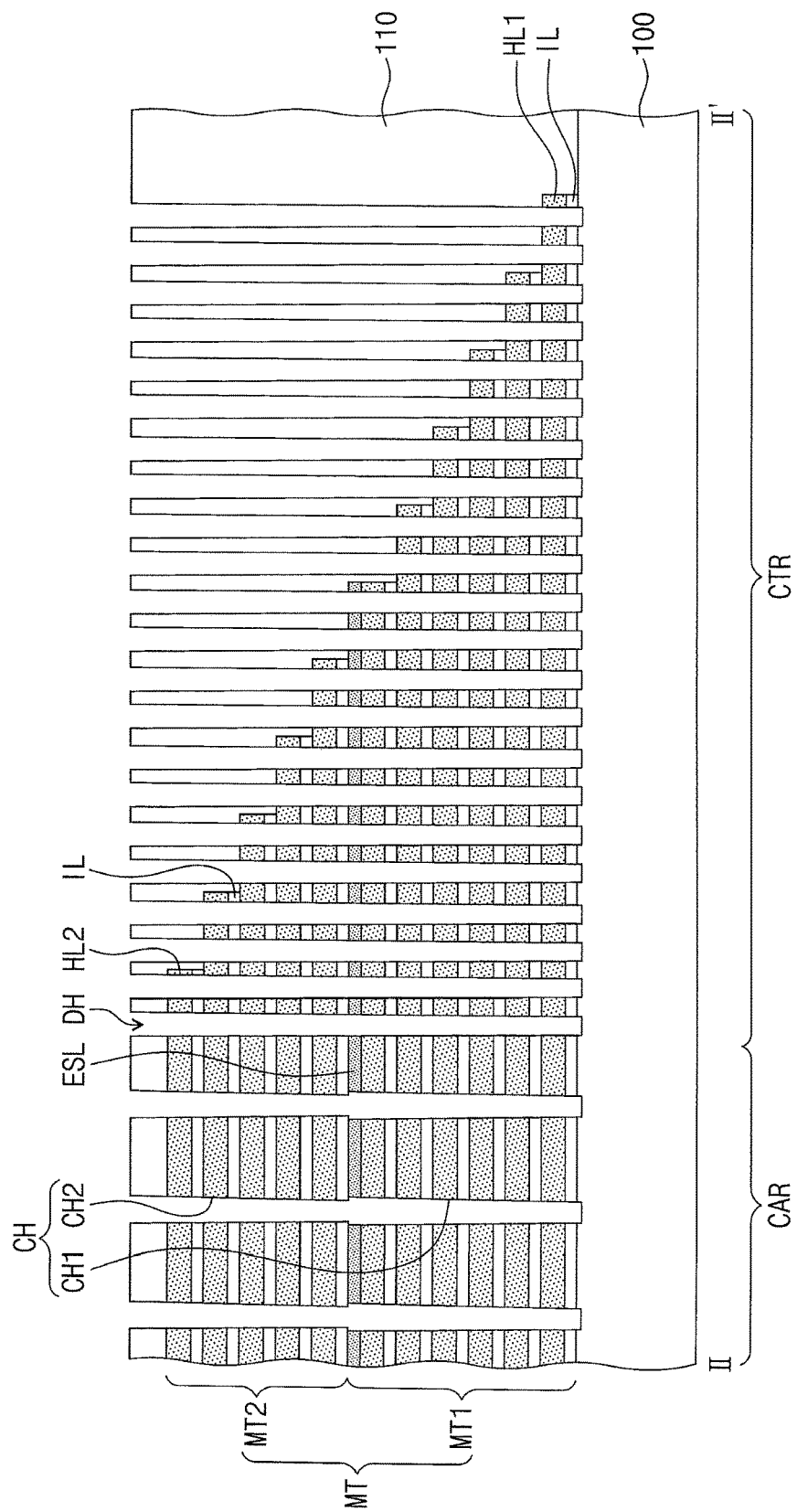

Referring to FIGS. 3 and 11, second channel holes (sometimes referred to as upper channel holes) CH2 may be formed to penetrate the upper mold structure MT2 on the cell array region CAR. The second channel holes CH2 may expose the sacrificial insulating patterns SIP. A diameter of each of the second channel holes CH2 may become progressively less toward the substrate 100. The second channel holes CH2 may vertically overlap with the first channel holes CH1, respectively. A method of forming the second channel holes CH2 may be substantially the same as the method of forming the first channel holes CH1. In some embodiments, the second channel holes CH2 may be misaligned with the first channel holes CH1 when the second channel holes CH2 are formed (see FIG. 5C). In this case, the etch stop layer ESL may prevent the lower mold structure MT1 from being etched.

The sacrificial insulating patterns SIP exposed through the second channel holes CH2 may be selectively removed. Thus, the second channel hole CH2 may be connected to the first channel hole CH1 to form a channel hole CH. Since the first channel hole CH1 and the second channel hole CH2 are formed by different processes, a diameter of the channel hole CH may be sharply changed. For example, the diameter of the channel hole CH may increase sharply at an interface the upper mold structure MT2 and the lower mold structure MT1. An inner side wall of the channel hole CH may have a stepped profile.

Figure 12:
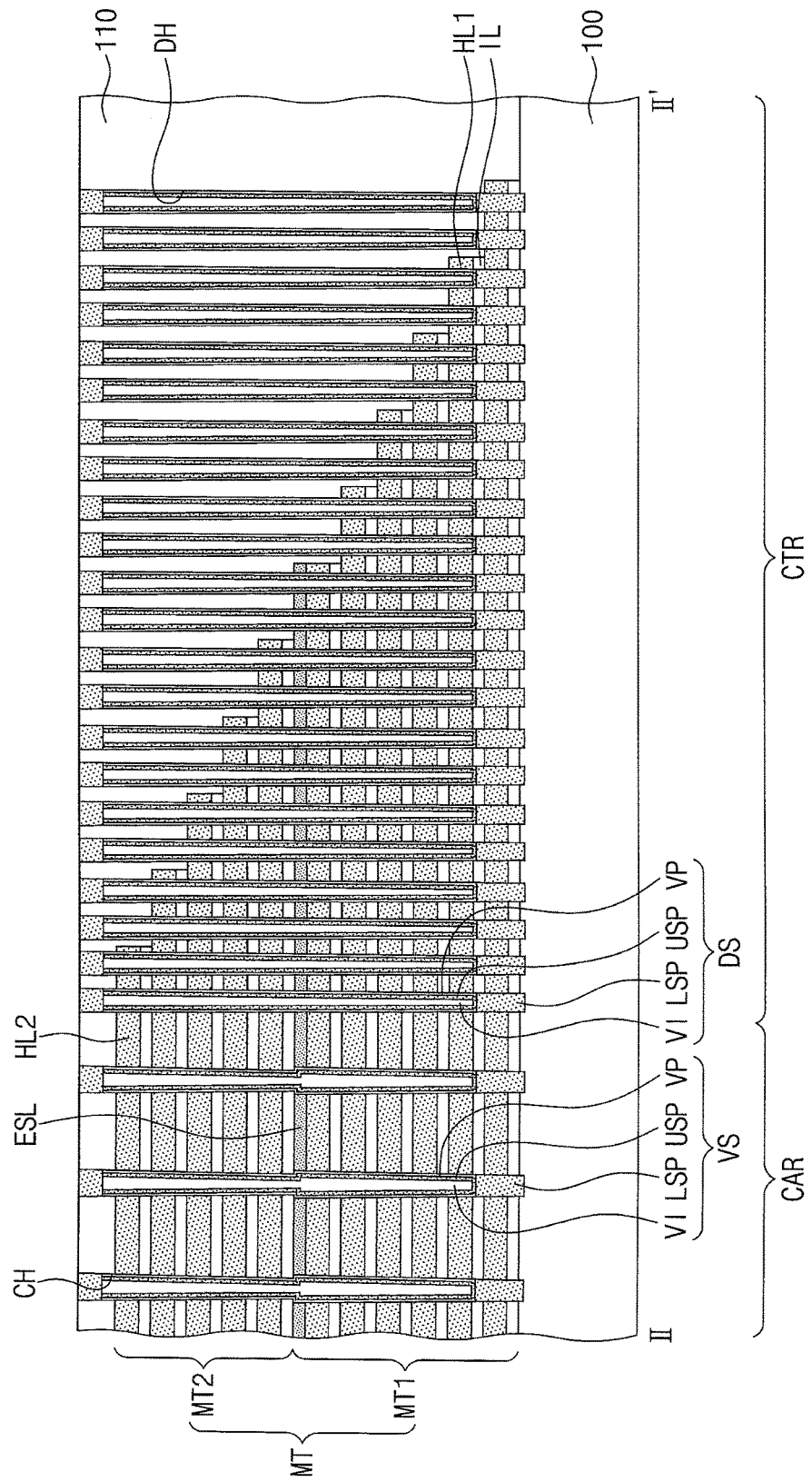

Referring to FIGS. 3 and 12, vertical structures VS may be formed in the channel holes CH, and dummy structures DS may be formed in the dummy holes DH. In the present embodiment, the vertical structures VS and the dummy structures DS may be formed at the same time.

In more detail, lower semiconductor patterns LSP may be formed on the substrate 100 exposed through the channel holes CH and the dummy holes DH. The lower semiconductor patterns LSP may fill lower regions of the channel or dummy holes CH and DH, respectively. The lower semiconductor patterns LSP may be formed by a selective epitaxial growth (SEG) process using the substrate 100 exposed through the channel and dummy holes CH and DH as a seed layer.

A vertical insulating layer VP and an upper semiconductor pattern USP may be formed to sequentially cover an inner side wall of each of the channel and dummy holes CH and DH. Each of the vertical insulating layer VP and the upper semiconductor pattern USP may be formed using an ALD process and a CVD process. Subsequently, a filling insulation pattern VI may be formed to completely fill each of the channel and dummy holes CH and DH. Top ends of the vertical insulating layer VP, the upper semiconductor pattern USP and the filling insulation pattern VI in each of the holes CH and DH may be recessed, and a contact pad may be formed in the recessed region of each of the holes CH and DH.

Figure 13:
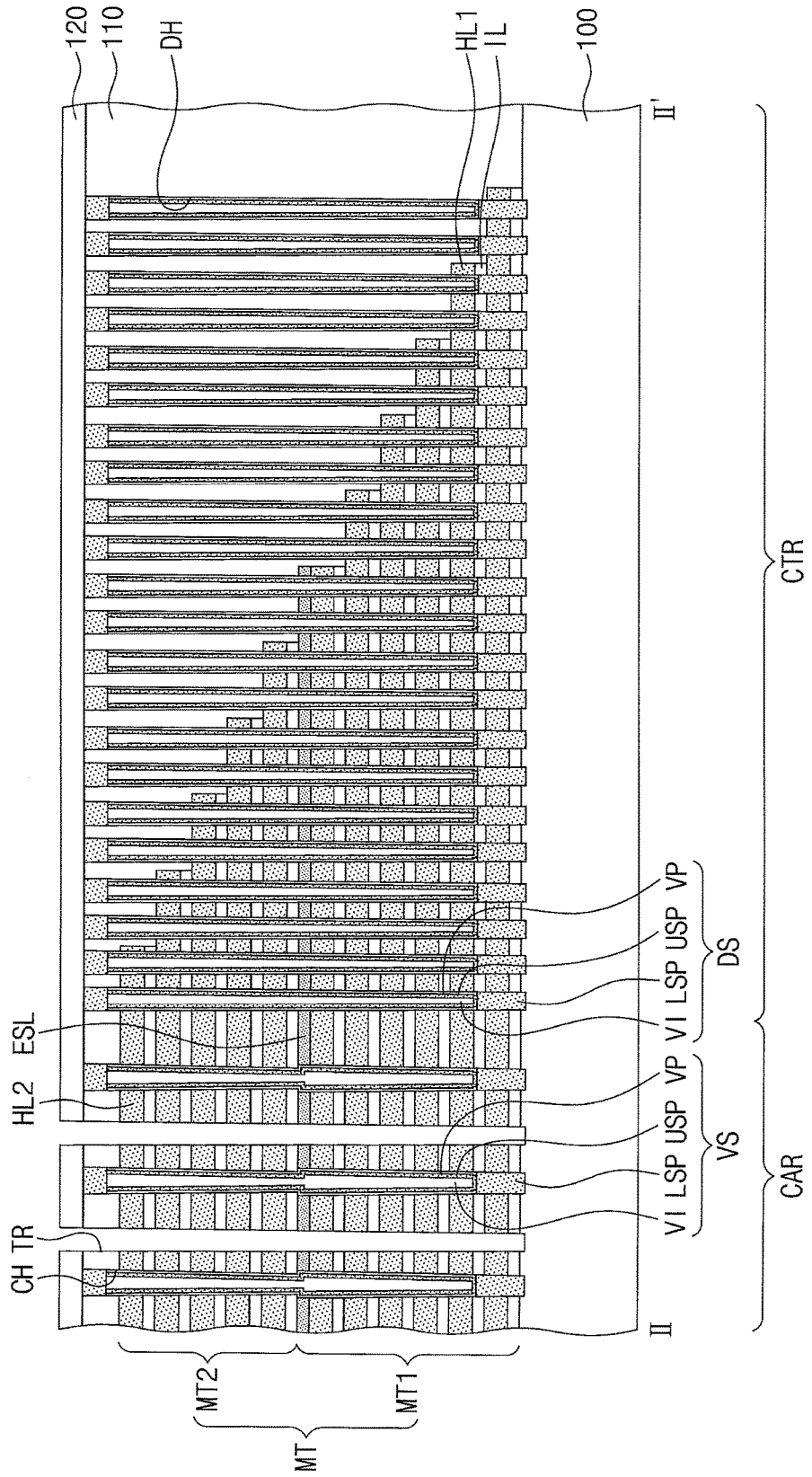

Referring to FIGS. 3 and 13, a first interlayer insulating layer 120 may be formed on the filling insulation layer 110. The first interlayer insulating layer 120 and the mold structure MT may be patterned to form a plurality of mold structures MT laterally spaced apart from each other. The mold structures MT may extend in the second direction D2 and may be arranged in the first direction D1. A trench TR may be defined between the mold structures MT adjacent to each other. The trenches TR may expose portions of the substrate 100. The trenches TR may extend in parallel to the mold structures MT in the second direction D2.

Referring again to FIGS. 3, 4A, and 4B, the first and second sacrificial layers HL1 and HL2 may be replaced with electrodes EL, thereby forming the stack structure ST including the lower and upper structures SS1 and SS2. In more detail, the first and second sacrificial layers HL1 and HL2 exposed through the trenches TR may be selectively removed to form empty spaces, and the electrodes EL may be formed in the empty spaces, respectively.

Dopants may be injected into the substrate 100 exposed through the trenches TR to form common source regions CSR. Insulating spacers SP and a common source plug CSP may be formed in each of the trenches TR. The common source plug CSP may be connected to the common source region CSR.

A second interlayer insulating layer 130 may be formed on the first interlayer insulating layer 120. Bit line contact plugs BPLG may be formed to penetrate the second and first interlayer insulating layers 130 and 120. The bit line contact plugs BPLG may be electrically connected to the vertical structures VS, respectively. Contact plugs CP may be formed to penetrate the second and first interlayer insulating layers 130 and 120 and the filling insulation layer 110. The contact plugs CP may be connected to the electrodes EL on the connection region CTR. Bit lines BL and interconnection lines CL may be formed on the second interlayer insulating layer 130. The bit lines BL may be electrically connected to the bit line contact plugs BPLG and the interconnection lines CL may be electrically connected to the contact plugs CP.

In the method for manufacturing the 3D semiconductor memory device according to some embodiments of the inventive concepts, the lower mold structure MT1 and the first channel holes CH1 may be formed, and then, the upper mold structure MT2 and the second channel holes CH2 may be formed. The first channel hole CH1 may be connected to the second channel hole CH2, and thus one channel hole CH may completely penetrate the stack structure having a great height. Thus, an integration density and reliability of the 3D semiconductor memory device may be improved.

In the manufacturing method according to some embodiments of the inventive concepts, the dummy holes DH may be formed by one etching process after the formation of the lower mold structure MT1 and the upper mold structure MT2. Thus, the process of forming the dummy holes DH may be simpler than the process of forming the channel holes CH, which includes two etching processes (i.e., the etching process for forming the first channel holes CH1 and the etching process for forming the second channel holes CH2).

According to a comparative example, a staircase structure may be formed at a lower mold structure on a connection region, an upper mold structure may be formed on the lower mold structure having the staircase structure, and a staircase structure may be formed at the upper mold structure on the connection region. However, in the manufacturing method according to some embodiments of the inventive concepts, the staircase structure may be formed on the connection region CTR at one time after the formation of the lower mold structure MT1 and the upper mold structure MT2. Thus, the manufacturing method according to the inventive concepts may be simplified as compared with the manufacturing method according to the comparative example. In addition, the manufacturing method according to the inventive concepts may easily realize a staircase structure having a complex structure, as compared with the comparative example.

Figure 14:
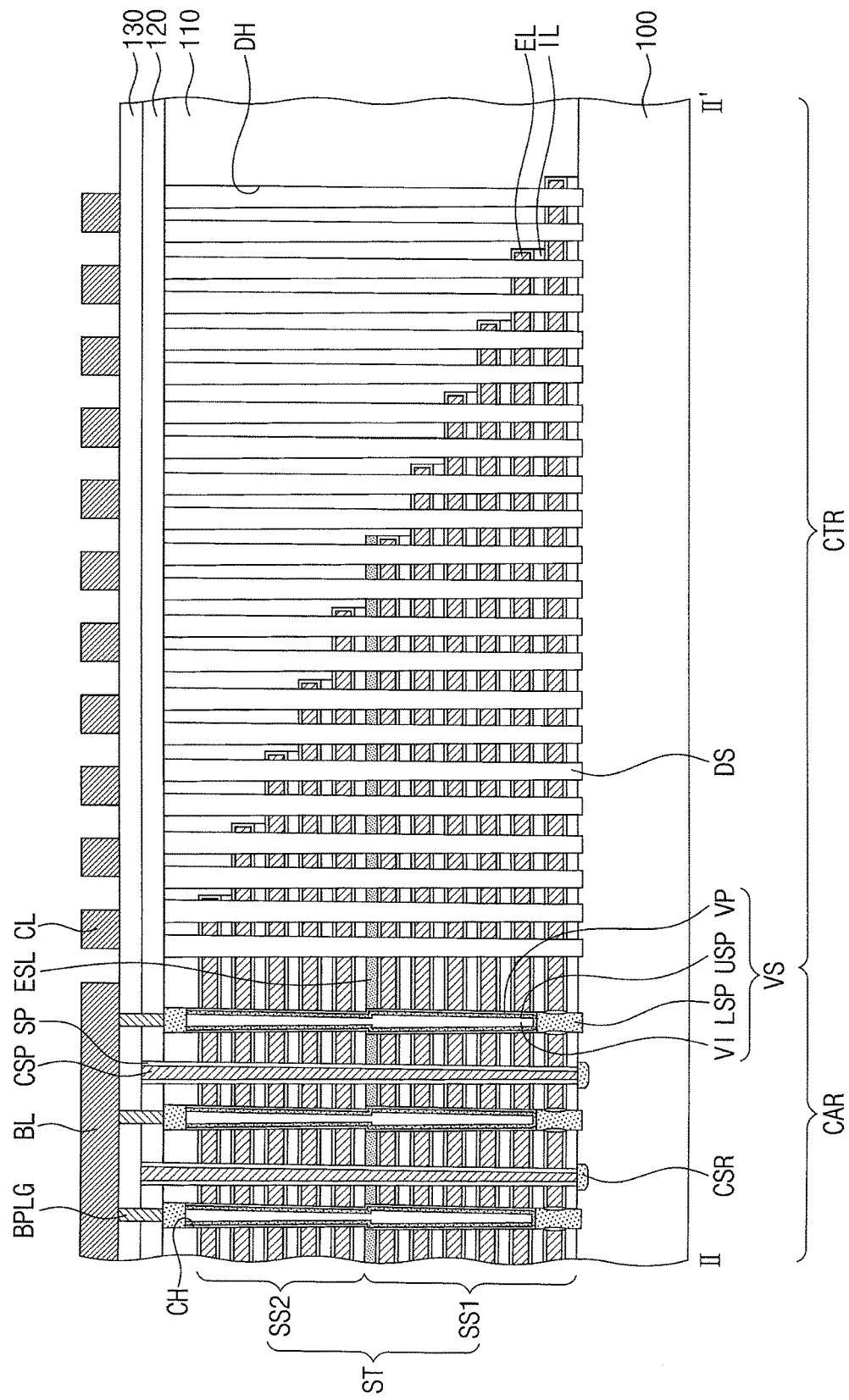
FIGS. 14, 15, and 16 are cross-sectional views taken along the line II-II' of FIG. 3 to illustrate 3D semiconductor memory devices according to some embodiments of the inventive concepts.
Figure 15:
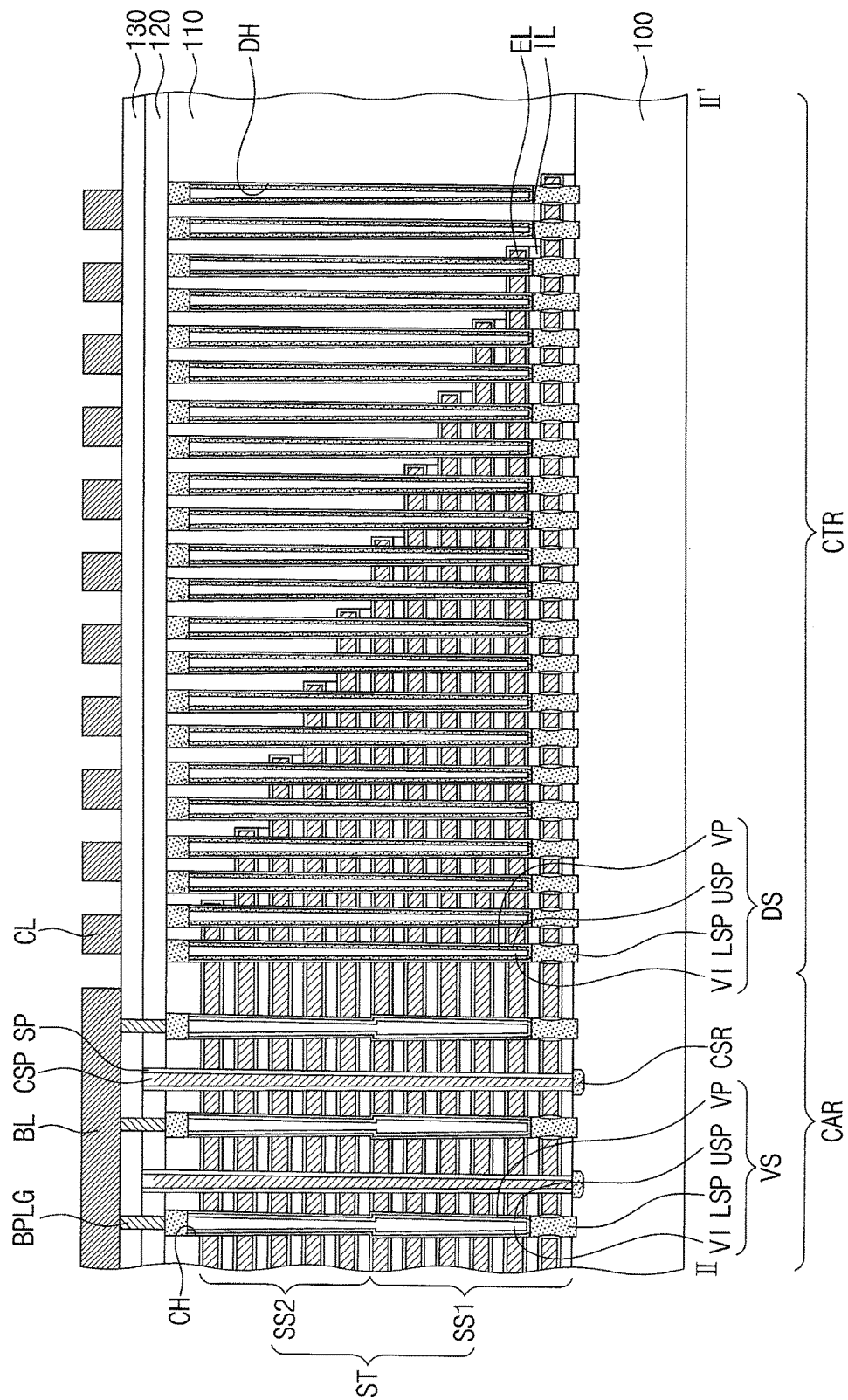
Figure 16:
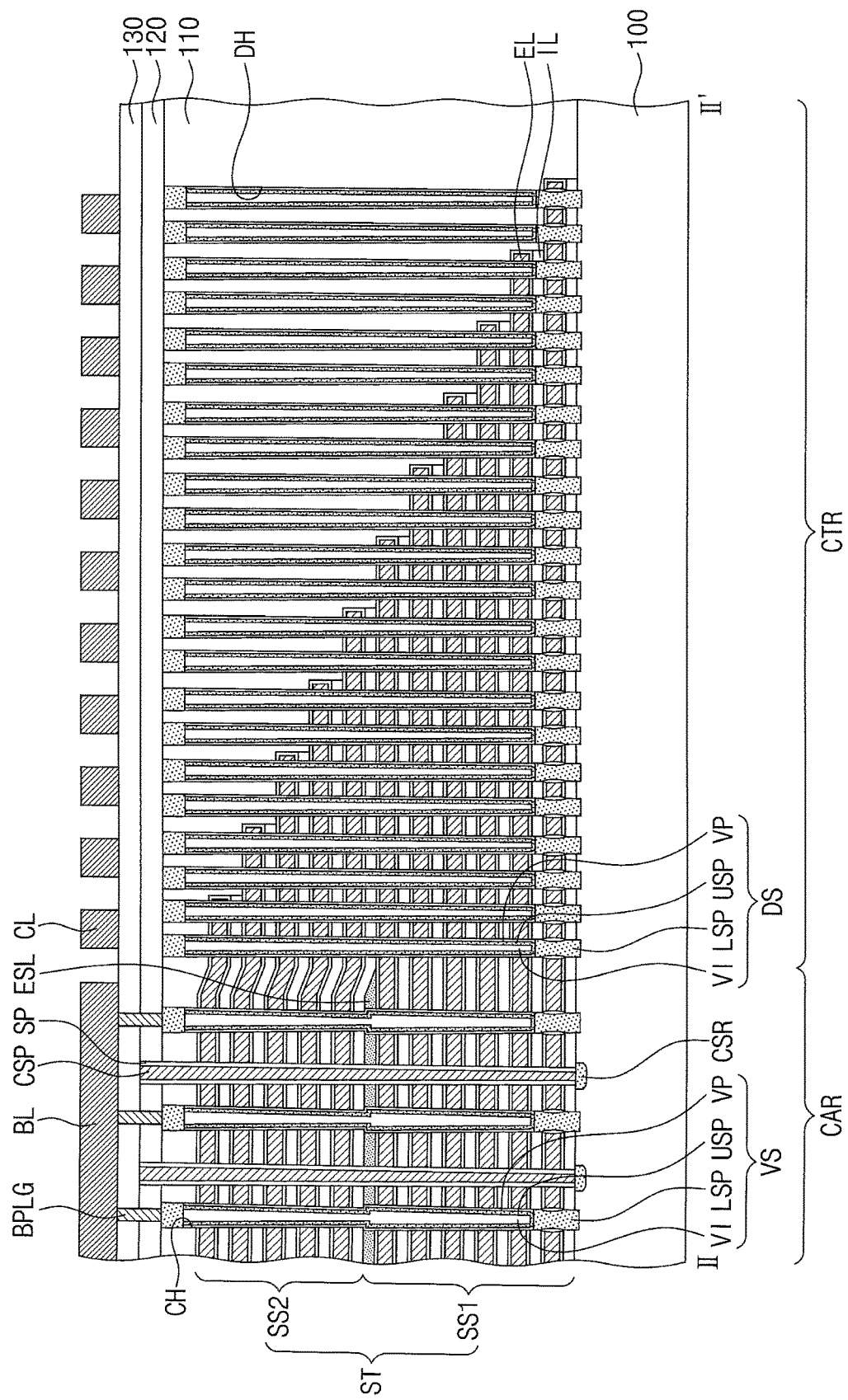

FIGS. 14, 15, and 16 are cross-sectional views taken along the line II-II' of FIG. 3 to illustrate 3D semiconductor memory devices according to some embodiments of the inventive concepts. In the present embodiments, the descriptions to the same technical features as in the embodiments of FIGS. 3, 4A, 4B, 5A, 5B, and 5C will be omitted or mentioned briefly for the purpose of ease and convenience in explanation. In other words, differences between the present embodiments and the embodiments of FIGS. 3, 4A, 4B, 5A, 5B, and 5C will be mainly described hereinafter.

In some embodiments, referring to FIGS. 3 and 14, each of dummy structures DS may include a dummy pattern. A layer or component of each of the dummy structures DS may be different from the layer(s) or component(s) of each of the vertical structures VS, unlike the embodiment described above with reference to FIG. 4B. The dummy pattern of the dummy structure DS may be formed of a single layer, e.g., a silicon oxide layer, a silicon nitride layer, a silicon oxynitride layer, or a poly-silicon layer. The dummy patterns filling the dummy holes DH may be formed on the resultant structure described with reference to FIGS. 3 and 10, thereby manufacturing the 3D semiconductor memory device according to the present embodiment.

In some embodiments, referring to FIGS. 3 and 15, the etch stop layer ESL of the uppermost layer of the lower structure SS1 may be omitted. The 3D semiconductor memory device according to the present embodiment may be manufactured by forming the second channel holes CH2 and the dummy holes DH on the resultant structure of FIGS. 3 and 9 at the same time. Since the etch stop layer ESL is omitted, the dummy holes DH may also be formed during the etching process for forming the second channel holes CH2.

In some embodiments, referring to FIGS. 3 and 16, the etch stop layer ESL may selectively exist at the uppermost layer of the lower structure SS1 on only the cell array region CAR thereby creating a vertical step height in an uppermost surface of the upper stack structure within the CAR. In other words, the etch stop layer ESL may not exist in the lower structure SS1 disposed on the connection region CTR. The etch stop layer ESL may be patterned to remain on only the cell array region CAR in the resultant structure described with reference to FIGS. 3 and 6, thereby manufacturing the 3D semiconductor memory device according to the present embodiment. In the present embodiment, since the etch stop layer ESL on the connection region CTR is omitted, the dummy holes DH may also be formed during the etching process for forming the second channel holes CH2.

Figure 17:
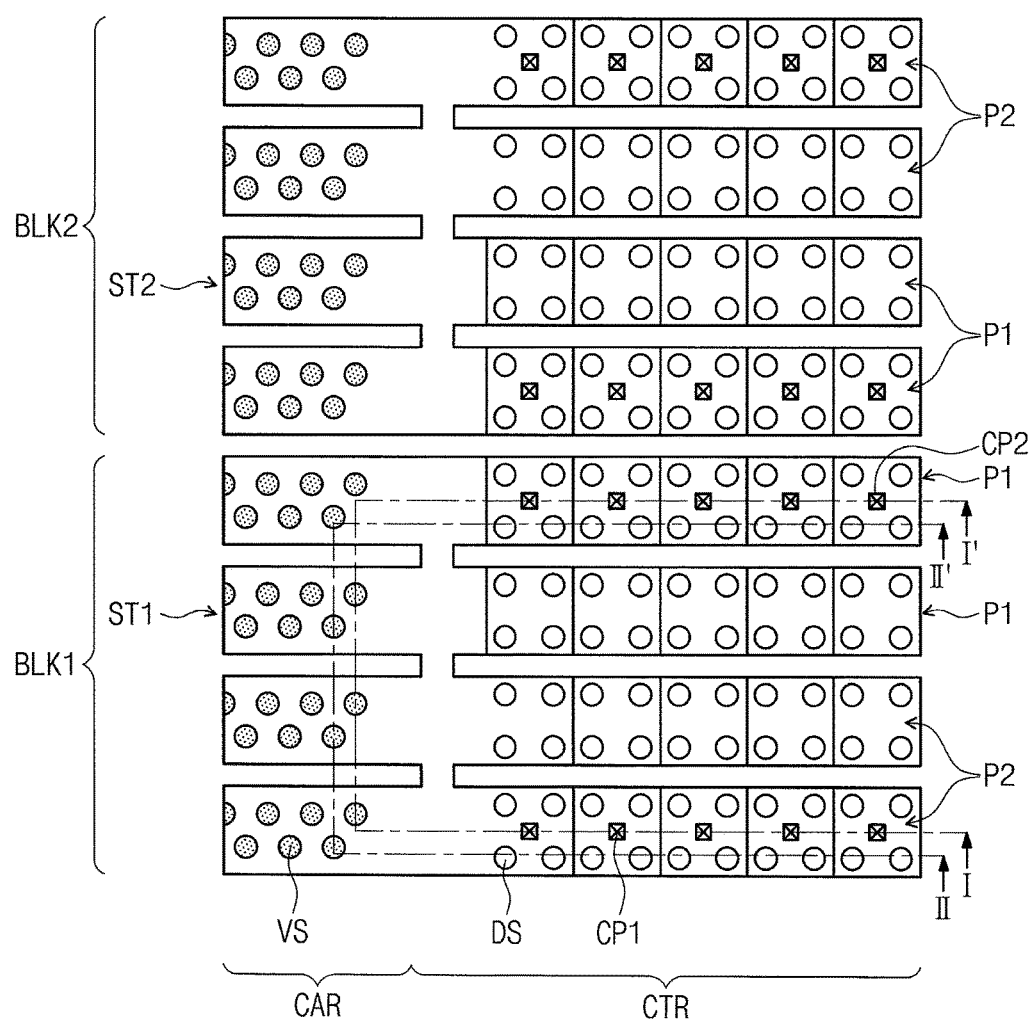
FIG. 17 is a plan view illustrating a 3D semiconductor memory device according to some embodiments of the inventive concepts.
Figure 18:
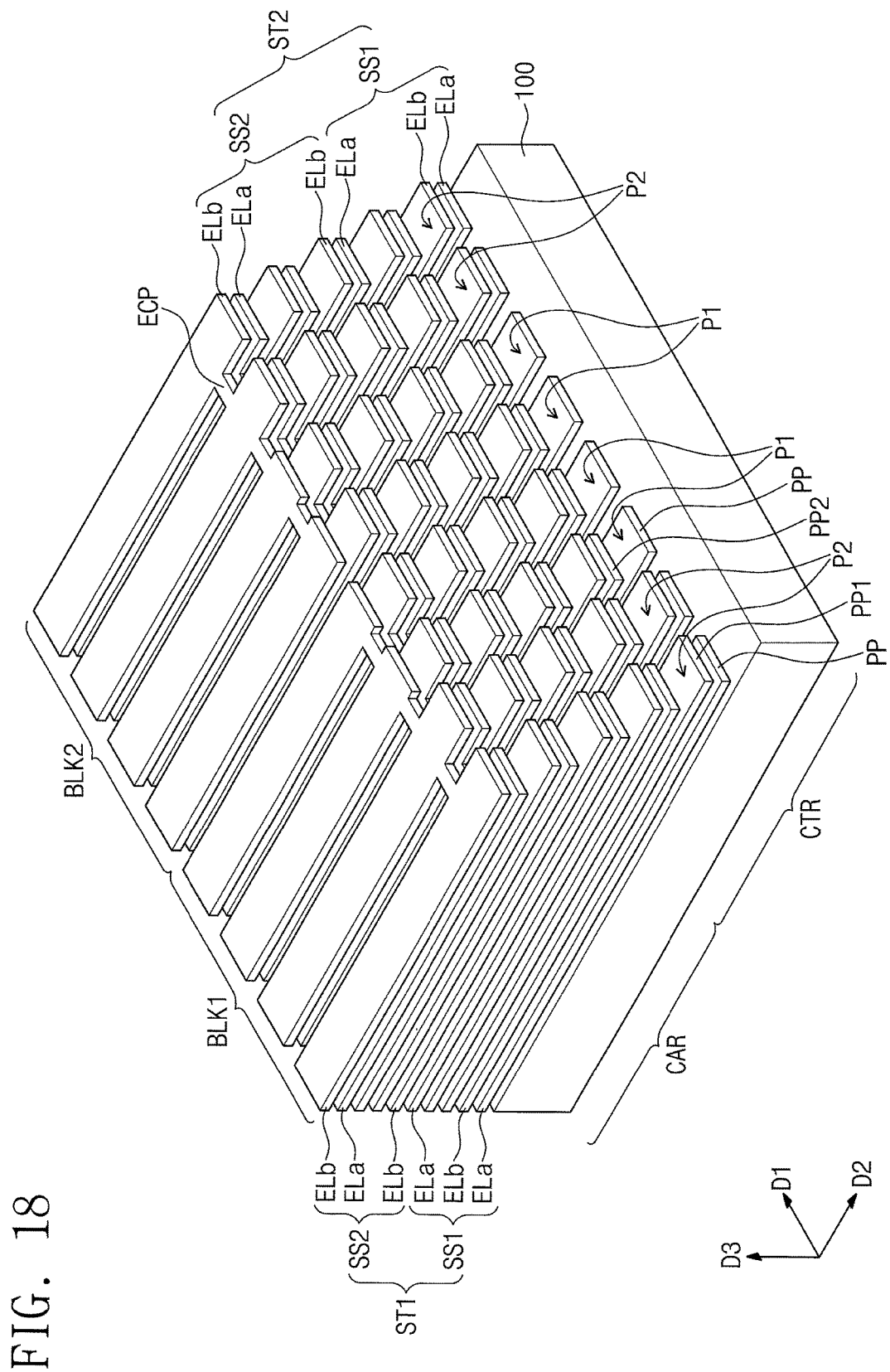
FIG. 18 is a perspective view illustrating first and second electrodes of the 3D semiconductor memory device of FIG. 17.
Figure 19A:
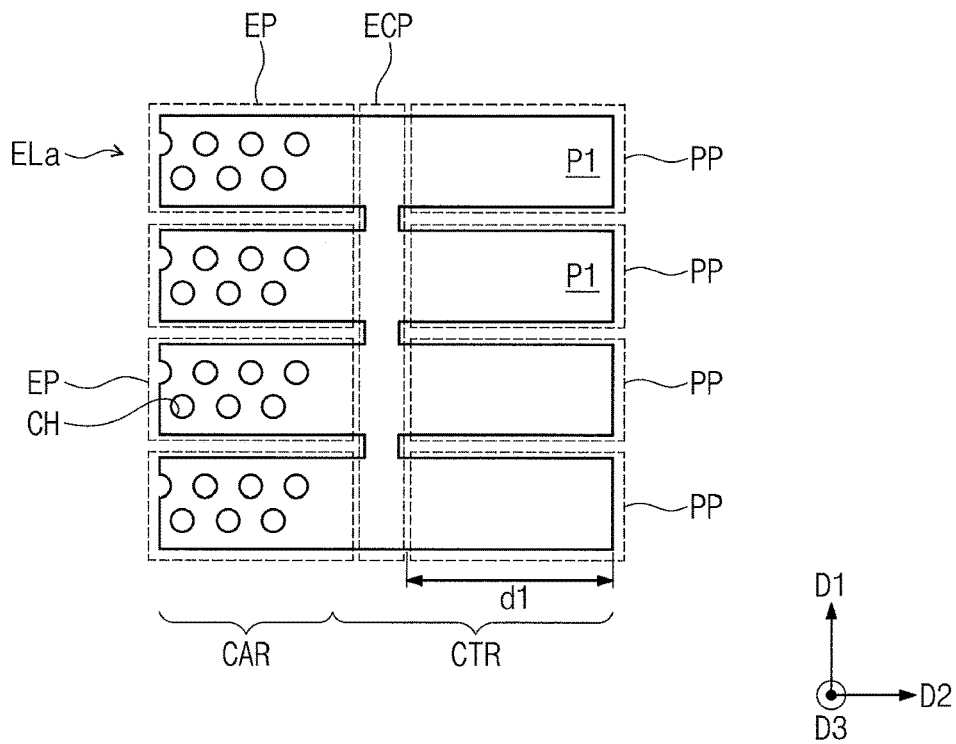
FIG. 19A is a plan view illustrating one of the first electrodes of FIGS. 17 and 18.
Figure 19B:
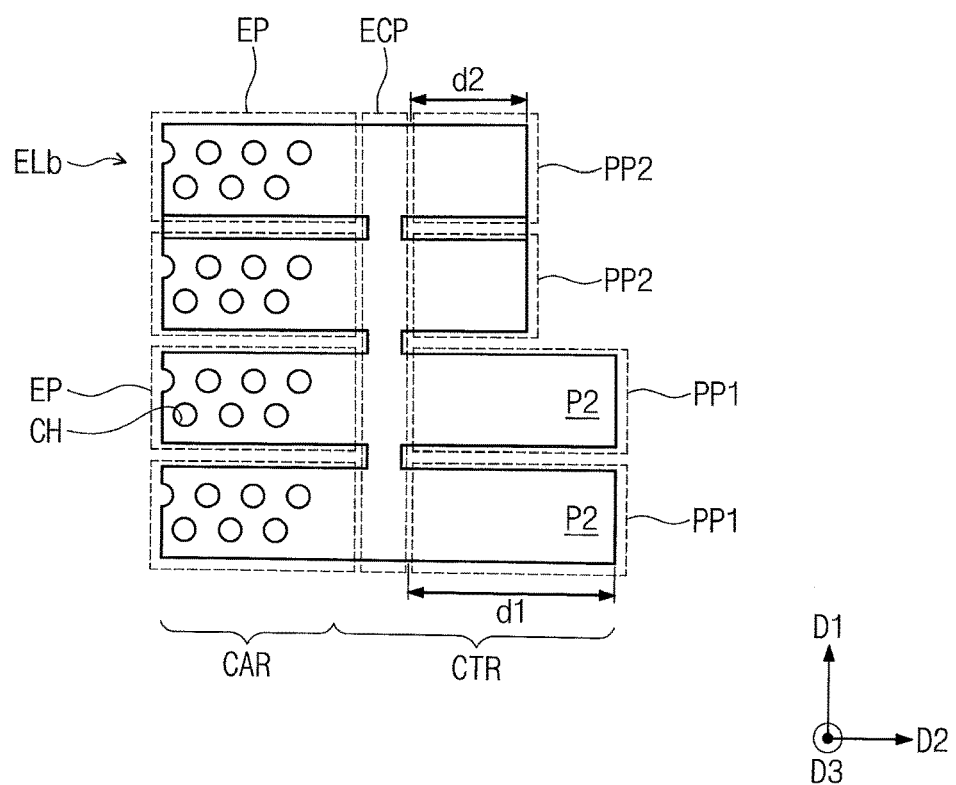
FIG. 19B is a plan view illustrating one of the second electrodes of FIGS. 17 and 18.
Figure 20A:
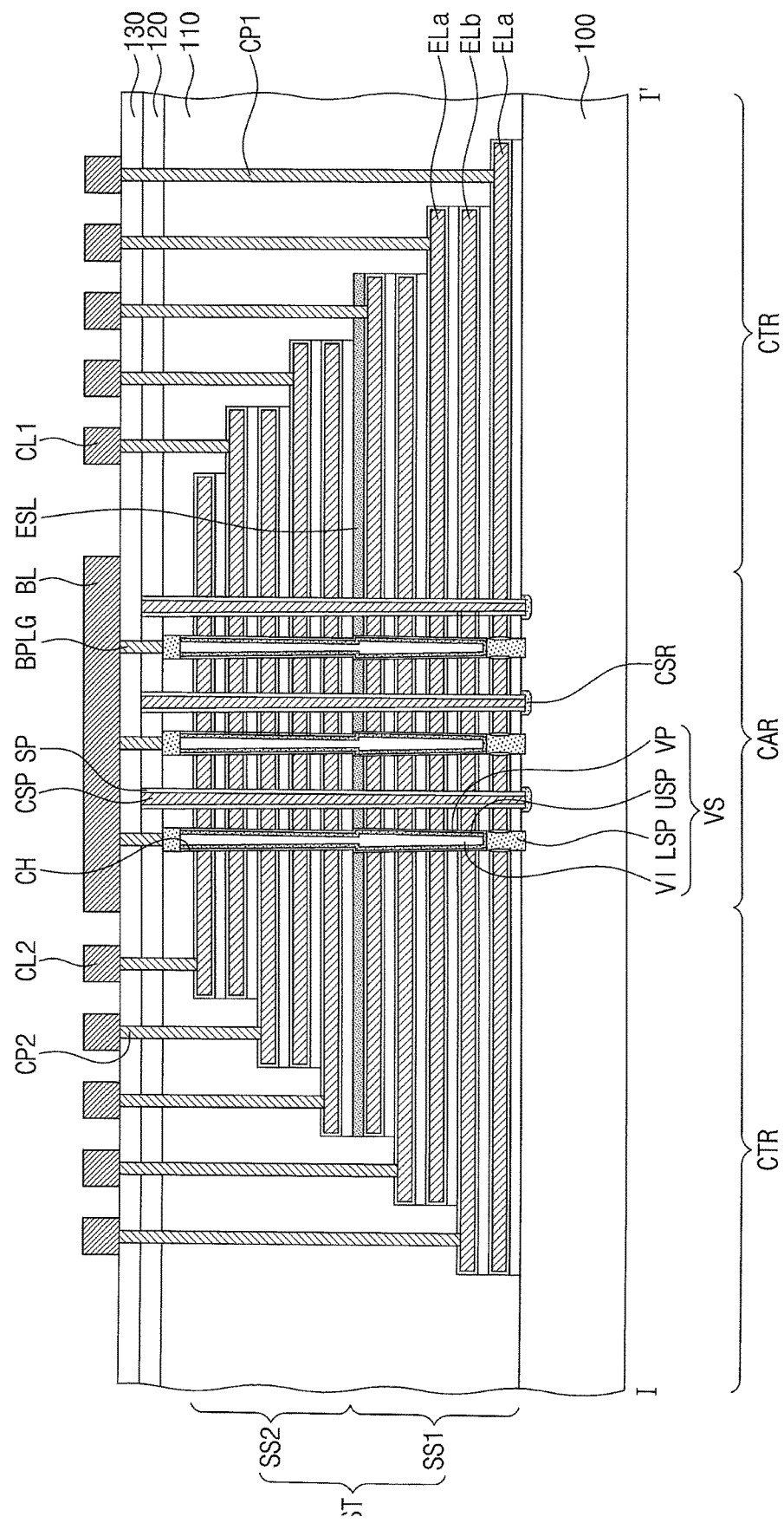
FIGS. 20A and 20B are cross-sectional views taken along lines I-I' and II-II' of FIG. 17, respectively.
Figure 20B:
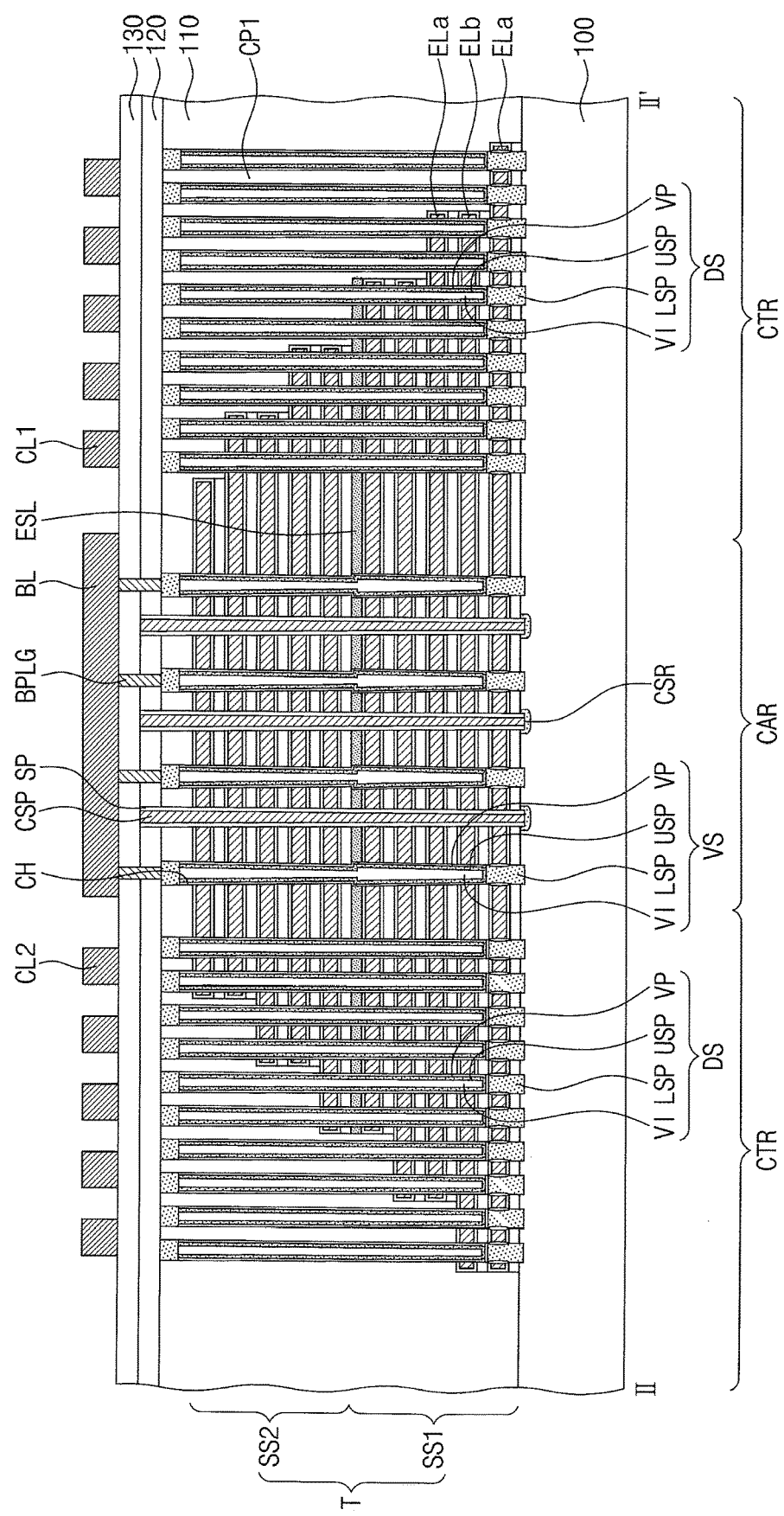

FIG. 17 is a plan view illustrating a 3D semiconductor memory device according to some embodiments of the inventive concepts. FIG. 18 is a perspective view illustrating first and second electrodes of the 3D semiconductor memory device of FIG. 17. FIG. 19A is a plan view illustrating one of the first electrodes of FIGS. 17 and 18. FIG. 19B is a plan view illustrating one of the second electrodes of FIGS. 17 and 18. FIGS. 20A and 20B are cross-sectional views taken along lines I-I' and II-II' of FIG. 17, respectively. In the present embodiment, the descriptions to the same technical features as in the embodiments of FIGS. 3, 4A, 4B, 5A, 5B, and 5C will be omitted or mentioned briefly for the purpose of ease and convenience in explanation. In other words, differences between the present embodiment and the embodiments of FIGS. 3, 4A, 4B, 5A, 5B, and 5C will be mainly described hereinafter.

Referring to FIGS. 17, 18, 19A, 19B, 20A, and 20B, a plurality of cell array blocks BLK1 and BLK2 may be disposed on a substrate 100. In some embodiments, first and second cell array blocks BLK1 and BLK2 may be spaced apart from each other on the substrate 100. The first cell array block BLK1 may include a first stack structure ST1 including first electrodes ELa and second electrodes ELb vertically and alternately stacked, and the second cell array block BLK2 may include a second stack structure ST2 including first electrodes ELa and second electrodes ELb vertically and alternately stacked. Each of the first and second stack structures ST1 and ST2 may include a lower structure SS1 and an upper structure SS2.

Each of the first electrodes ELa may have a first pad region P1 that is exposed by the second electrode ELb disposed immediately on each of the first electrodes ELa on the connection region CTR. Each of the second electrodes ELb may have a second pad region P2 that is exposed by the first electrode ELa disposed immediately on each of the second electrodes ELb on the connection region CTR. In each of the first and second stack structures ST1 and ST2, the first pad regions P1 of the first electrodes ELa may be disposed at positions horizontally and vertically different from each other. In each of the first and second stack structures ST1 and ST2, the second pad regions P2 of the second electrodes ELb may be disposed at positions horizontally and vertically different from each other. The first pad regions P1 of the first electrodes ELa may be adjacent to the second pad regions P2 of the second electrodes ELb in a first direction D1 when viewed in a plan view.

Each of the first and second stack structures ST1 and ST2 may have a first staircase structure formed by the first pad regions P1 of the first electrodes ELa and a second staircase structure formed by the second pad regions P2 of the second electrodes ELb. The first pad regions P1 of the first electrodes ELa may be arranged in a second direction D2 when viewed in a plan view. The first staircase structure formed by the first pad regions P1 of the first electrodes ELa may have a staircase shape downward along the second direction D2. The second pad regions P2 of the second electrodes ELb may be arranged in the second direction D2 when viewed in a plan view. The second staircase structure formed by the second pad regions P2 of the second electrodes ELb may have a staircase shape downward along the second direction D2. The second staircase structure may be adjacent to the first staircase structure in the first direction D1 when viewed in a plan view.

The first staircase structure of the first stack structure ST1 may be adjacent to the first staircase structure of the second stack structure ST2 in the first direction D1. In other words, the first pad regions P1 of the first stack structure ST1 may be adjacent to the first pad regions P1 of the second stack structure ST2 in the first direction D1. The first and second stack structures ST1 and ST2 adjacent to each other in the first direction D1 may be mirror-symmetrical on the connection region CTR.

The first and second electrodes ELa and ELb included in each of the first and second stack structures ST1 and ST2 will be described in more detail with reference to FIGS. 19A and 19B.

Referring to FIGS. 17, 18, and 19A, each of the first electrodes ELa may include a plurality of electrode portions EP, an electrode connecting portion ECP, and at least one or more protrusions PP. The electrode portions EP may extend in the second direction D2 on the cell array region CAR and may be spaced apart from each other in the first direction D1. In other words, the electrode portions EP may be laterally spaced apart from each other.

The electrode connecting portion ECP may extend in the first direction D1 on the connection region CTR and may horizontally connect the electrode portions EP to each other. In other words, in each of the first and second stack structures ST1 and ST2, the electrode portions EP disposed at the same height from the substrate 100 may be in an equipotential state by the electrode connecting portion ECP.

The protrusions PP may protrude from the electrode connecting portion ECP in the second direction D2 on the connection region CTR. In some embodiments, the number of the protrusions PP of the first electrode ELa may be equal to or less than the number of the electrode portions EP of the first electrode ELa. In some embodiments, the protrusions PP may extend continuously from the electrode portions EP in the second direction D2 and may be spaced apart from each other in the first direction D1.

All of the protrusions PP of the first electrode ELa may extend from the electrode connecting portion ECP by a first length d1 in the second direction D2. In other words, the protrusions PP of the first electrode ELa may have the same length d1 in the second direction D2. The lengths d1 of the protrusions PP of the first electrodes ELa may decrease sequentially as a vertical distance from the substrate 100 increases. The first electrode ELa may have the first pad region P1 located at one or more of the protrusions PP.

Referring to FIGS. 17, 18, and 19B, each of the second electrodes ELb may include a plurality of electrode portions EP, an electrode connecting portion ECP horizontally connecting the electrode portions EP to each other, and protrusions PP1 and PP2 protruding from the electrode connecting portion ECP, similarly to the first electrode ELa.

The protrusions PP1 and PP2 of the second electrode ELb may include first protrusions PP1 extending from the electrode connecting portion ECP by a first length d1 in the second direction D2, and second protrusions PP2 extending from the electrode connecting portion ECP by a second length d2 in the second direction D2. The second length d2 may be smaller than the first length d1. The second electrode ELb may have the second pad region P2 located at one or more of the first protrusions PP1. The first length d1 of the first protrusions PP1 of the second electrode ELb may be substantially equal to the first length d1 of the protrusions PP of the first electrode ELa disposed immediately under the second electrode ELb. The lengths d1 and d2 of the first and second protrusions PP1 and PP2 of the second electrodes ELb may decrease sequentially as a vertical distance from the substrate 100 increases.

Referring again to FIGS. 17, 18, 19A, 19B, 20A, and 20B, the electrode portions EP of the second electrode ELb may overlap with the electrode portions EP of the first electrode ELa when viewed in a plan view. The electrode connecting portion ECP of the first electrode ELa may overlap with the electrode connecting portion ECP of the second electrode ELb.

The first protrusions PP1 of the second electrode ELb may overlap with some of the protrusions PP of the first electrode ELa disposed under the second electrode ELb when viewed in a plan view. The second protrusions PP2 of the second electrode ELb may expose others of the protrusions PP of the first electrode ELa disposed under the second electrode ELb when viewed in a plan view. Side walls of the first protrusions PP1 of the second electrode ELb may be vertically aligned with side walls of the protrusions PP of the first electrode ELa disposed thereunder. Side walls of the second protrusions PP2 of the second electrode ELb may be vertically aligned with side walls of the protrusions PP of the first electrode ELa disposed thereon.

Vertical structures VS may penetrate the first and second stack structures ST1 and ST2 on the cell array region CAR. A diameter of the vertical structure VS may be sharply changed between the lower structure SS1 and the upper structure SS2. In other words, a side wall of the vertical structure VS may have a stepped profile.

First contact plugs CP1 may be connected to the first electrodes ELa of the first and second stack structures ST1 and ST2 on the connection region CTR, and second contact plugs CP2 may be connected to the second electrodes ELb of the first and second stack structures ST1 and ST2 on the connection region CTR. The number of the first contact plugs CP1 connected to the first and second stack structures ST1 and ST2 may be equal to the number of the first electrodes ELa included in the first and second stack structures ST1 and ST2. The number of the second contact plugs CP2 connected to the first and second stack structures ST1 and ST2 may be equal to the number of the second electrodes ELb included in the first and second stack structures ST1 and ST2.

The first contact plugs CP1 may be disposed on the first staircase structure, and the second contact plugs CP2 may be disposed on the second staircase structure. The first contact plugs CP1 may be connected to the first pad regions P1 of the first electrodes ELa, and the second contact plugs CP2 may be connected to the second pad regions P2 of the second electrodes ELb. In other words, each of the first contact plugs CP1 may be connected to one of the protrusions PP of each of the first electrodes ELa, and each of the second contact plugs CP2 may be connected to one of the first protrusions PP1 of each of the second electrodes ELb. The first contact plugs CP1 may be spaced apart from the second contact plugs CP2 in the first direction D1.

Dummy structures DS may penetrate a filling insulation layer 110 and the first and second stack structures ST1 and ST2 on the connection region CTR. Some of the dummy structures DS may penetrate the first pad regions P1 of the first electrodes ELa. Others of the dummy structures DS may penetrate the second pad regions P2 of the second electrodes ELb. The dummy structures DS may be adjacent to the first and second contact plugs CP1 and CP2. However, the dummy structures DS may not be in contact with the first and second contact plugs CP1 and CP2.

The dummy structures DS may physically support the first and second stack structures ST1 and ST2 on the connection region CTR. In some embodiments, each of the dummy structures DS may include a vertical insulating layer VP, an upper semiconductor pattern USP, a lower semiconductor pattern LSP, and a filling insulation pattern VI, like the vertical structure VS. In certain embodiments, each of the dummy structures DS may include a dummy pattern (see FIG. 14). A diameter of the dummy structure DS may become progressively less toward the substrate 100. A side wall of the dummy structure DS may have a continuous profile.

Bit lines BL may be electrically connected to the vertical structures VS through bit line contact plugs BPLG on the cell array region CAR. First interconnection lines CL1 may be connected to the first contact plugs CP1 on the connection region CTR, and second interconnection lines CL2 may be connected to the second contact plugs CP2 on the connection region CTR.

FIGS. 21 to 24 are perspective views illustrating a method for manufacturing a 3D semiconductor memory device, according to some embodiments of the inventive concepts. In detail, FIGS. 21 to 24 are perspective views illustrating a method for forming the first staircase structure and the second staircase structure of the stack structure described with reference to FIGS. 17, 18, 19A, 19B, 20A, and 20B. In the present embodiment, the descriptions to the same technical features as in the embodiments of FIGS. 3 and 6 to 13 will be omitted or mentioned briefly for the purpose of ease and convenience in explanation. In other words, differences between the present embodiment and the embodiments of FIGS. 3 and 6 to 13 will be mainly described hereinafter.

Referring to FIG. 21, a mold structure MT may be formed on an entire top surface of a substrate 100 including a cell array region CAR and a connection region CTR. The mold structure MT may include a lower mold structure MT1 including first sacrificial layers HL1 vertically stacked, and an upper mold structure MT2 including second sacrificial layers HL2 vertically stacked.

A first mask pattern MP1 may be formed on the mold structure MT. The first mask pattern MP1 may expose a portion of the mold structure MT disposed on the connection region CTR. Next, a process of etching a portion of the mold structure MT by using the first mask pattern MP1 as an etch mask and a trimming process of shrinking the first mask pattern MP1 may be alternately repeated. A plurality of the sacrificial layers HL1 and HL2 exposed by the first mask pattern MP1 may be etched by the process of etching the portion of the mold structure MT. An etch depth in the etching process may be equal to or greater than twice a vertical pitch of the sacrificial layers HL1 and HL2 vertically stacked. A side wall of the first mask pattern MP1 may be laterally shifted by a specific distance during the trimming process, and thus an area of the first mask pattern MP1 may be reduced.

Figure 22:
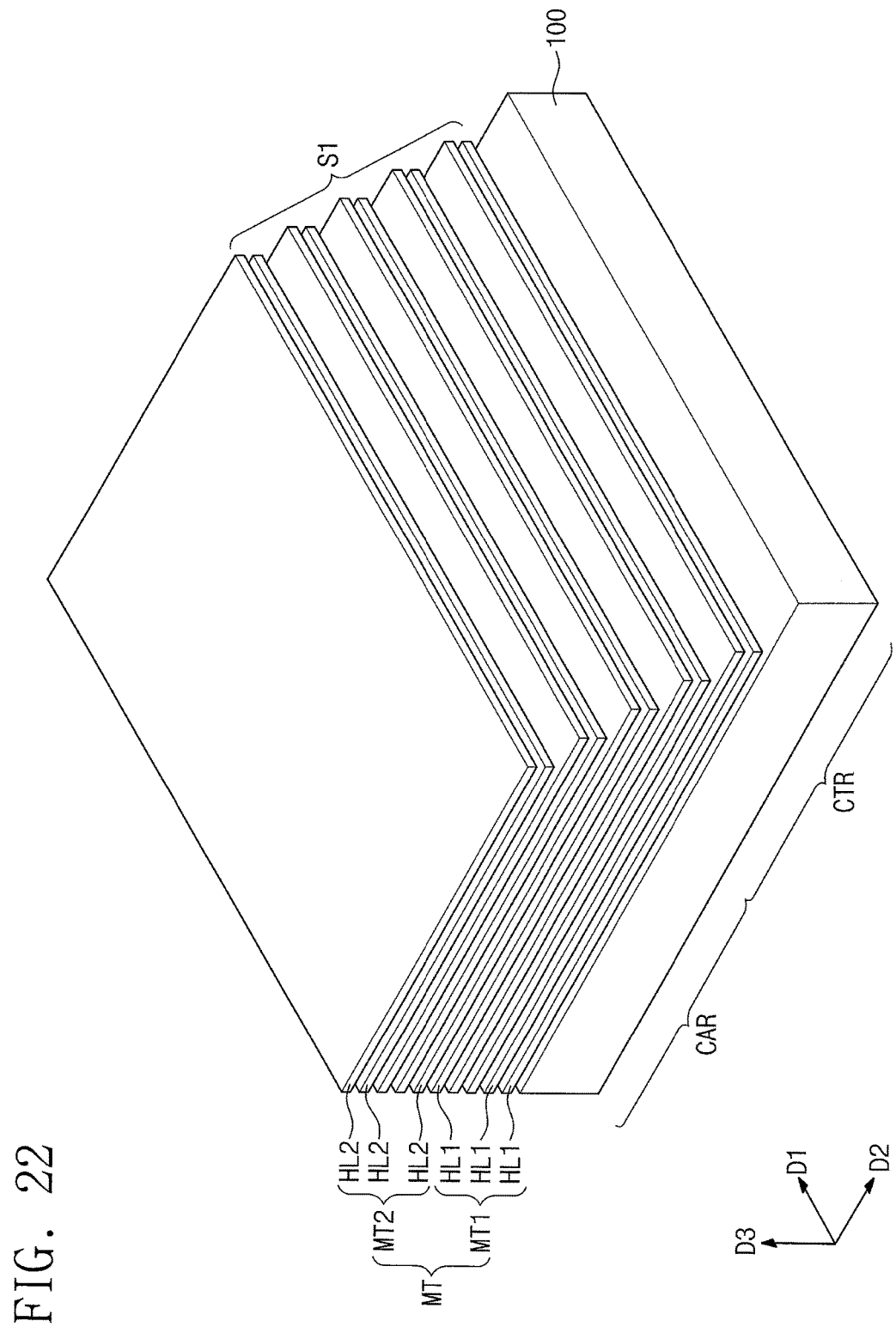

The etching process and the trimming process may be alternately repeated to form a first staircase structure S1 that exposes end portions of even-numbered sacrificial layers HL1 and HL2 of the mold structure MT, as illustrated in FIG. 22.

Figure 23:
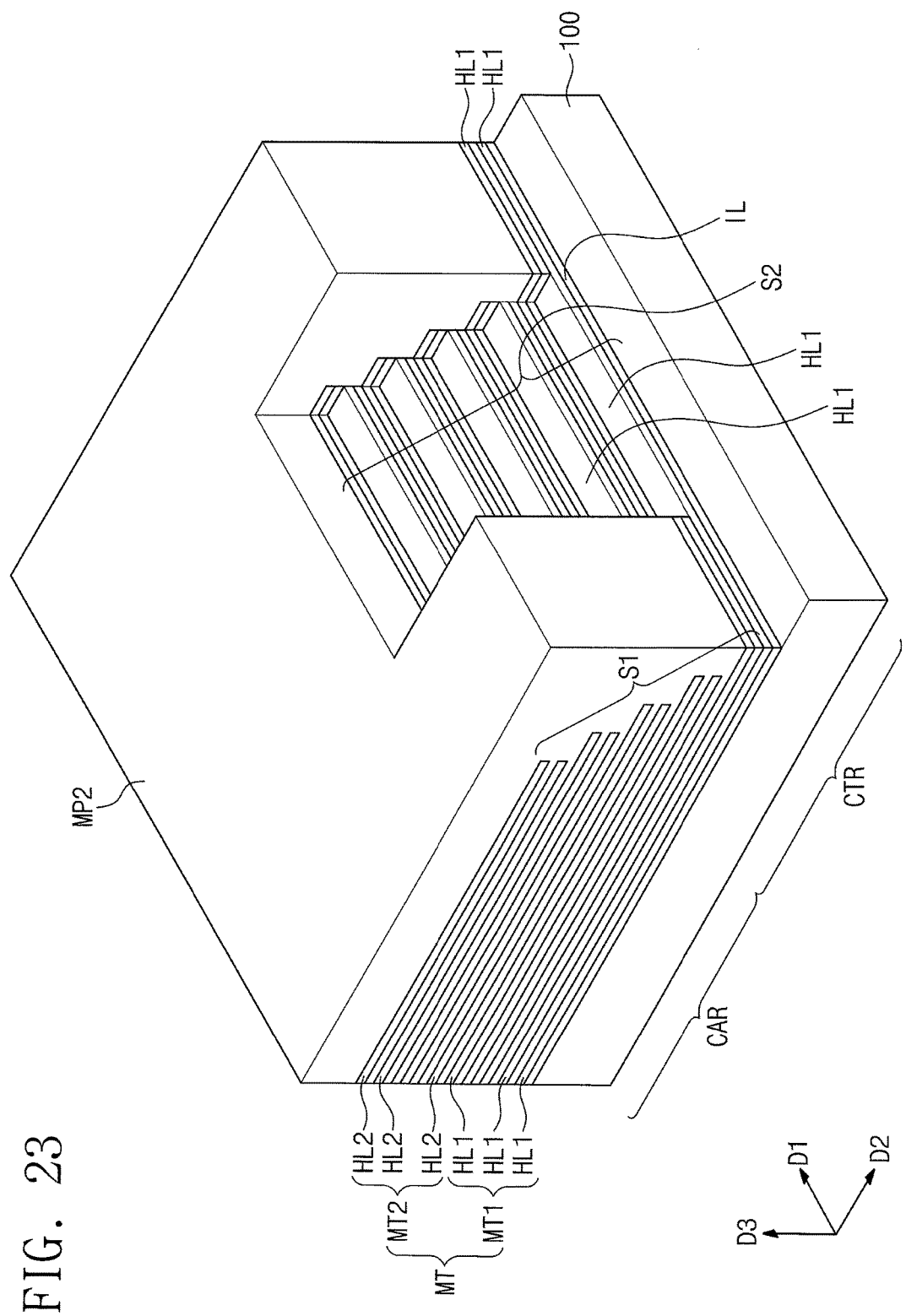

Referring to FIG. 23, a second mask pattern MP2 may be formed on the mold structure MT having the first staircase structure S1. The second mask pattern MP2 may have an opening that exposes a portion of the first staircase structure S1 of the mold structure MT.

An etching process may be performed using the second mask pattern MP2 as an etch mask to etch a portion of the mold structure MT. An etch depth of the etching process using the second mask pattern MP2 as the etch mask may be smaller than the etch depth of the etching process using the first mask pattern MP1 as the etch mask. For example, the etch depth of the etching process using the second mask pattern MP2 may be substantially equal to the vertical pitch of the sacrificial layers HL1 and HL2. The etching process using the second mask pattern MP2 as the etch mask may be performed to form a second staircase structure S2 that exposes end portions of odd-numbered sacrificial layers HL1 and HL2 of the mold structure MT.

As a result, the mold structure MT disposed on the connection region CTR may have the first staircase structure S1 and the second staircase structure S2. Since the second staircase structure S2 is formed by etching a portion of the first staircase structure S1, the first and second staircase structures S1 and S2 may be adjacent to each other in the first direction D1.

Figure 24:
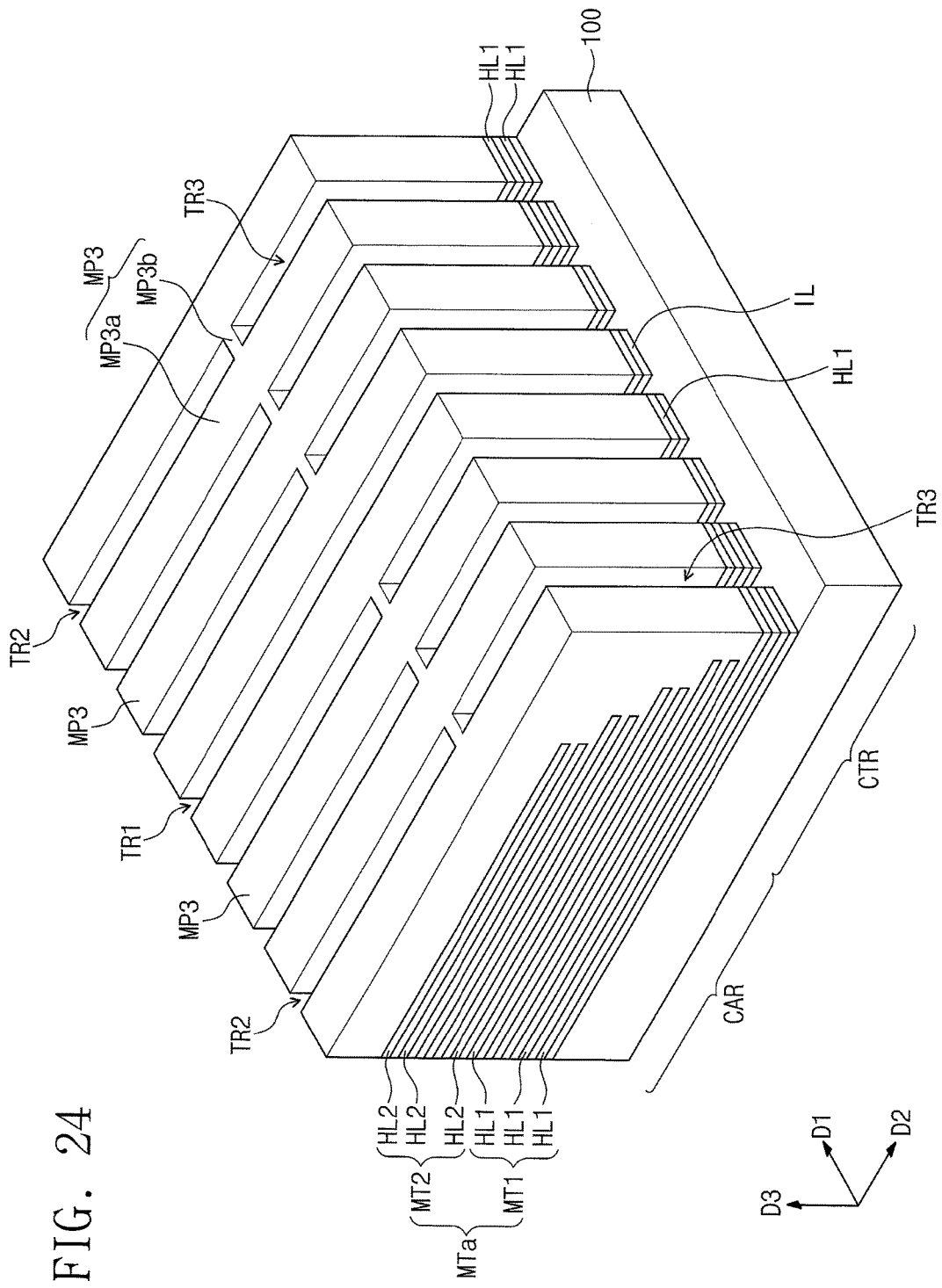

Referring to FIG. 24, third mask patterns MP3 may be formed on the mold structure MT. Each of the third mask patterns MP3 may include first line portions MP3a and a second line portion MP3b on the connection region CTR. The first line portions MP3a may extend in the second direction D2 and may be spaced apart from each other in the first direction D1, when viewed in a plan view. The second line portion MP3b may extend in the first direction D1 to connect the first line portions MP3a.

The mold structure MT may be patterned using the third mask patterns MP3 as etch masks to form a first mold structure MTa and a second mold structure which are laterally spaced apart from each other. A first trench TR1 may be defined between the first mold structure MTa and the second mold structure. Second trenches TR2 may be formed on the cell array region CAR, and third trenches TR3 may be formed on the connection region CTR. The second trenches TR2 may horizontally separate portions of the sacrificial layers HL1 and HL2, which correspond to the electrode portions EP. The third trenches TR3 may horizontally separate portions of the sacrificial layers HL1 and HL2, which correspond to the protrusions PP.

Each of the first mold structure MTa and the second mold structure may have first and second staircase structures S1 and S2. In each of the first mold structure MTa and the second mold structure, each of odd-numbered sacrificial layers HL1 and HL2 may include a plurality of electrode portions, an electrode connecting portion connecting the electrode portions, and a plurality of protrusions, like the first electrode ELa described with reference to FIG. 19A. In each of the first mold structure MTa and the second mold structure, each of even-numbered sacrificial layers HL1 and HL2 may include a plurality of electrode portions, an electrode connecting portion connecting the electrode portions, and a plurality of protrusions, like the second electrode ELb described with reference to FIG. 19B. Subsequently, the processes described with reference to FIGS. 10 to 13 may be performed.

In the 3D semiconductor memory device according to some embodiments of the inventive concepts, the channel holes may completely penetrate the stack structure having a great height. Thus, the integration density and reliability of the device may be improved. Since the dummy holes are formed using one etching process, the processes for manufacturing the device according to the inventive concepts may be simplified. According to some embodiments of the inventive concepts, a complex staircase structure may be easily formed at the stack structure.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed:

1. A vertical memory device structure comprising:
a vertical channel structure vertically penetrating through an upper structure and a lower structure of a stack structure in a cell array region of the device, the vertical channel structure having a side wall with a stepped profile at a level in the vertical channel structure where the upper structure meets the lower structure; and
a vertical dummy structure vertically penetrating through a staircase structure defined by the upper structure and the lower structure in a connection region of the device, the vertical dummy structure having a side wall with a planar profile at the level where the upper structure meets the lower structure and the planar profile extending into the upper structure and into the lower structure,
wherein the stack structure includes alternating electrode layers and insulating layers extending from the cell array region on a substrate of the device to the connection region on the substrate of the device,
wherein the lower structure includes a first plurality of the alternating electrode layers and insulating layers and an etch stop layer on the first plurality of the alternating electrode layers and insulating layers,
wherein the upper structure includes a second plurality of the alternating electrode layers and insulating layers, the upper structure on the lower structure,
wherein a first diameter of the vertical channel structure at a level of a lowest layer in the upper structure is less than a second diameter of the vertical channel structure at a level of an uppermost layer in the lower structure, and
wherein the etch stop layer is disposed in only the cell array region.

2. The vertical memory device structure of claim 1, wherein the etch stop layer terminates within the cell array region to provide a vertical step height in an uppermost surface of the stack structure, the vertical step height corresponding to a difference between a first distance between the uppermost surface of the stack structure and a surface of a substrate within a portion of the cell array region comprising the etch stop layer and a second distance between the uppermost surface of the stack structure and the surface of the substrate within a portion of the cell array region remote from the etch stop layer.

3. The vertical memory device structure of claim 1, wherein the uppermost layer in the lower structure comprises one of the insulating layers or one of the electrode layers.

4. The vertical memory device structure of claim 1, wherein the vertical channel structure and the vertical dummy structure include identical layers.

5. The vertical memory device structure of claim 1, wherein the vertical channel structure and the vertical dummy structure include different layers.

6. The vertical memory device structure of claim 1, further comprising:
an intermediate structure included in the stack structure between the upper structure and the lower structure, the intermediate structure including a third plurality of the alternating electrode layers and insulating layers.

7. A vertical memory device structure comprising:
a stack structure including alternating electrode layers and insulating layers extending from a cell array region of the device to a connection region of the device;
a lower structure in the stack structure including an etch stop layer on an uppermost layer in the lower structure;
an upper structure in the stack structure on the etch stop layer;
a staircase structure defined by the upper and lower structures of the stack structure in the connection region;
a vertical channel structure vertically penetrating through the upper and lower structures of the stack structure in the cell array region, the vertical channel structure having a side wall with a stepped profile at a level in the vertical channel structure where the upper structure meets the etch stop layer; and
a vertical dummy structure vertically penetrating through the staircase structure, the vertical dummy structure having a side wall with a planar profile at the level in the vertical dummy structure where the upper structure meets the etch stop layer and the planar profile extending into the upper structure and into the lower structure,
wherein the etch stop layer is disposed in only the cell array region.

8. The vertical memory device structure of claim 7, wherein a first diameter of the vertical channel structure at a level of a lowest layer in the upper structure is less than a second diameter of the vertical channel structure at a level of the etch stop layer.

9. The vertical memory device structure of claim 7, wherein the vertical channel structure and the vertical dummy structure include identical layers.

10. The vertical memory device structure of claim 7, wherein the vertical channel structure and the vertical dummy structure include different layers.

11. The vertical memory device structure of claim 7, wherein the lower structure includes a first plurality of the alternating electrode layers and insulating layers and the upper structure includes a second plurality of the alternating electrode layers and insulating layers, the device further comprising:
an intermediate structure included in the stack structure between the upper structure and the lower structure, the intermediate structure including a third plurality of the alternating electrode layers and insulating layers.

12. A vertical memory device structure comprising:
a stack structure including alternating electrode layers and insulating layers extending from a cell array region of the device to a connection region of the device;
a lower structure in the stack structure including one of the electrode layers or one of the insulating layers as an uppermost layer in the lower structure;
an etch stop layer disposed on the uppermost layer in the lower structure
an upper structure in the stack structure directly on the uppermost layer in the lower structure;
a staircase structure defined by the upper and lower structures of the stack structure in the connection region;
a vertical channel structure vertically penetrating through the upper and lower structures of the stack structure in the cell array region, the vertical channel structure having a side wall with a stepped profile at a level in the vertical channel structure where the upper structure meets the uppermost layer in the lower structure; and
a vertical dummy structure vertically penetrating through the staircase structure, the vertical dummy structure having a side wall with a planar profile at the level in the vertical dummy structure where the upper structure meets the uppermost layer in the lower structure, wherein a diameter of the vertical dummy structure gradually decreases from a top surface of the vertical dummy structure to a bottom surface of the vertical dummy structure, wherein the etch stop layer is disposed in only the cell array region.

13. The vertical memory device structure of claim 11, wherein a first diameter of the vertical channel structure at a level of a lowest layer in the upper structure is less than a second diameter of the vertical channel structure at a level of the uppermost layer in the lower structure.

14. The vertical memory device structure of claim 7, wherein the vertical channel structure and the vertical dummy structure include identical layers.

15. The vertical memory device structure of claim 7, wherein the vertical channel structure and the vertical dummy structure include different layers.

16. The vertical memory device structure of claim 7, wherein the lower structure includes a first plurality of the alternating electrode layers and insulating layers and the upper structure includes a second plurality of the alternating electrode layers and insulating layers, the device further comprising:

an intermediate structure included in the stack structure between the upper structure and the lower structure, the intermediate structure including a third plurality of the alternating electrode layers and insulating layers.

* * * * *